United States Patent
Park et al.

(10) Patent No.: US 12,136,687 B2
(45) Date of Patent: Nov. 5, 2024

(54) QUANTUM DOT, AND A COMPOSITE AND AN ELECTRONIC DEVICE INCLUDING THE SAME

(71) Applicant: SAMSUNG ELECTRONICS CO., LTD., Suwon-si (KR)

(72) Inventors: Garam Park, Seoul (KR); Shang Hyeun Park, Yongin-si (KR); Min Jong Bae, Yongin-si (KR); Mi Hye Lim, Suwon-si (KR); Deukseok Chung, Yongin-si (KR); Shin Ae Jun, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 462 days.

(21) Appl. No.: 17/586,956

(22) Filed: Jan. 28, 2022

(65) Prior Publication Data
US 2022/0246804 A1    Aug. 4, 2022

(30) Foreign Application Priority Data
Feb. 3, 2021    (KR) .................. 10-2021-0015706

(51) Int. Cl.
*H01L 33/50*     (2010.01)
*C09K 11/02*     (2006.01)
(Continued)

(52) U.S. Cl.
CPC .......... *H01L 33/502* (2013.01); *C09K 11/025* (2013.01); *C09K 11/565* (2013.01); *C09K 11/703* (2013.01); *C09K 11/883* (2013.01)

(58) Field of Classification Search
CPC .................................................. H10K 50/115
See application file for complete search history.

(56) References Cited

U.S. PATENT DOCUMENTS

| 10,851,298 B2 | 12/2020 | Won et al. |
| 11,060,026 B2 | 7/2021 | Won et al. |

(Continued)

FOREIGN PATENT DOCUMENTS

| EP | 3760692 A1 | 1/2021 |
| KR | 20130022639 A | 3/2013 |

(Continued)

OTHER PUBLICATIONS

Christian Ippen et al., "InP/ZnSe/ZnS: A Novel Multishell System for InP Quantum Dots for Improved Luminescence Efficiency and Its application in a Light-Emitting Device," Journal of Information Display, Jun. 22, 2012, pp. 91-95, vol. 13, No. 2.

(Continued)

*Primary Examiner* — Yu-Hsi D Sun
(74) *Attorney, Agent, or Firm* — CANTOR COLBURN LLP

(57) ABSTRACT

A quantum dot composite includes a matrix and a plurality of quantum dots dispersed in the matrix, and a color conversion panel and a display panel including the same. The plurality of quantum dots include a metal including indium (In) and zinc and a non-metal including phosphorous (P), selenium, and sulfur, wherein the plurality of quantum dots includes a mole ratio of sulfur to indium of greater than or equal to about 3:1 and less than or equal to about 6:1, and a mole ratio of sulfur to selenium of greater than or equal about 0.69:1 and less than or equal to about 0.89, and a mole ratio of zinc to indium of greater than or equal to about 10:1 and less than or equal to about 12.4:1, and wherein the plurality of the quantum dots are configured to emit red light.

20 Claims, 13 Drawing Sheets

(51) Int. Cl.
    *C09K 11/56*     (2006.01)
    *C09K 11/70*     (2006.01)
    *C09K 11/88*     (2006.01)

(56) References Cited

U.S. PATENT DOCUMENTS

| | | |
|---|---|---|
| 11,193,062 B2 | 12/2021 | Park et al. |
| 2014/0001405 A1 | 1/2014 | Guo et al. |
| 2017/0052444 A1 | 2/2017 | Park et al. |
| 2018/0119007 A1 | 5/2018 | Ippen et al. |
| 2019/0211261 A1* | 7/2019 | Jang ................ C08F 220/06 |
| 2020/0024512 A1* | 1/2020 | Min ................ C09K 11/70 |
| 2020/0399536 A1* | 12/2020 | Kim ................ H05B 33/14 |

FOREIGN PATENT DOCUMENTS

| | | |
|---|---|---|
| KR | 20190085886 A | 7/2019 |
| KR | 2075626 B1 | 2/2020 |
| KR | 1020200026163 A | 3/2020 |
| KR | 20200074197 A | 6/2020 |

OTHER PUBLICATIONS

Eunseog Cho et al., "Modeling on the size dependent properties of InP quantum dots: a hybrid functional study," Nanotechnology, Apr. 25, 2013, pp. 1-5, vol. 24, Online at stacks.iop.org/Nano/24/215201.
Yu-Ho Won et al., "Highly efficient and stable InP/ZnSe/ZnS quantum dot light-emitting diodes," Nature, Nov. 27, 2019, pp. 634-651.

* cited by examiner

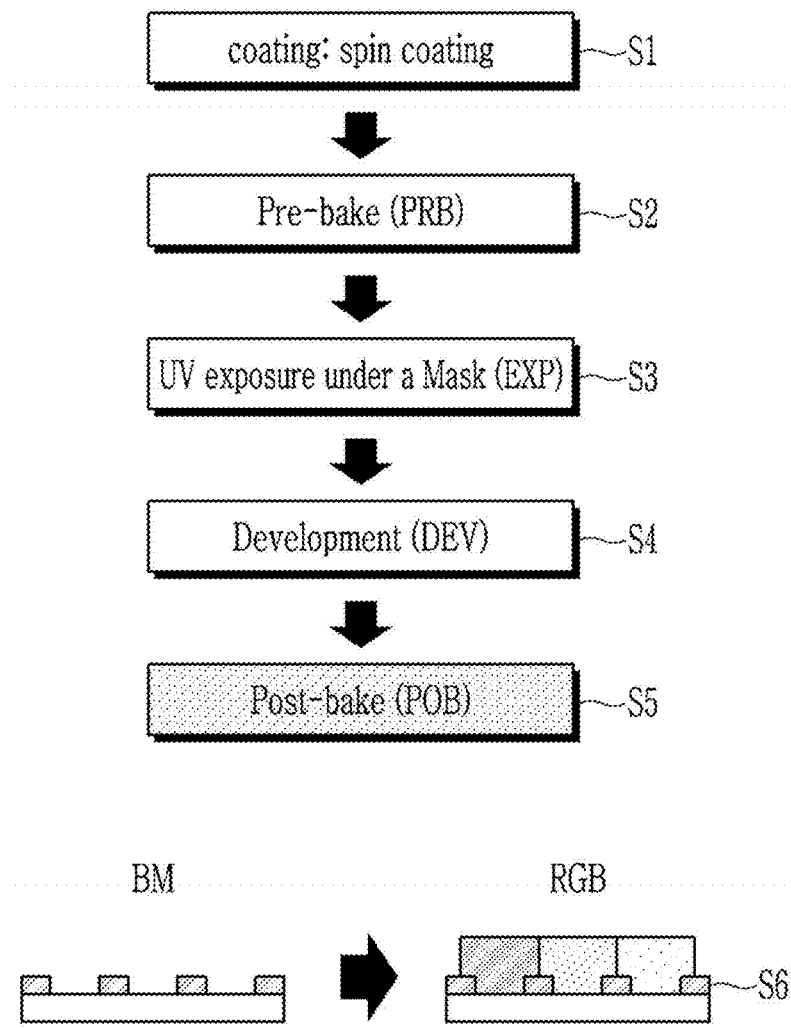

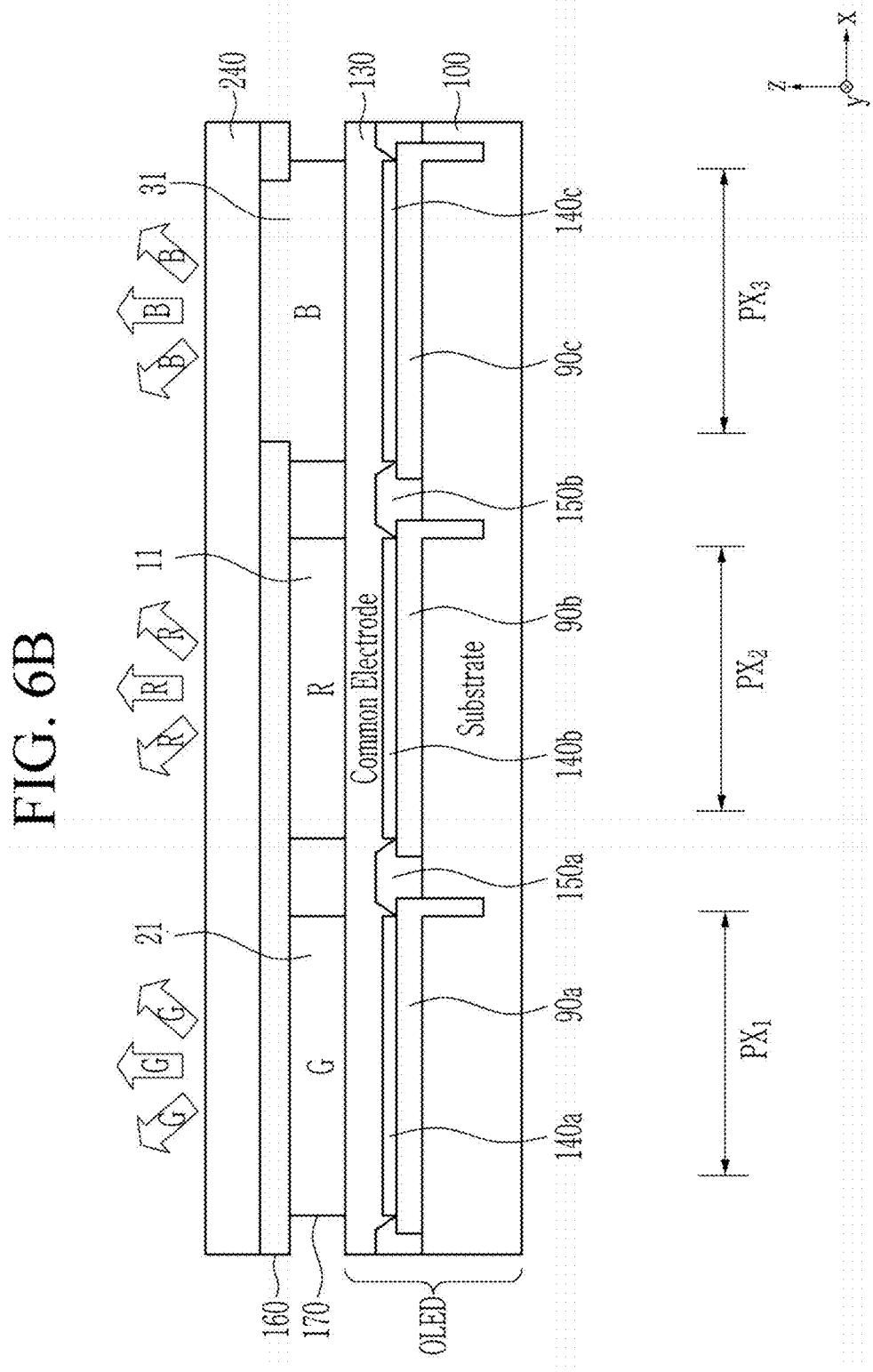

QUANTUM DOT, AND A COMPOSITE AND AN ELECTRONIC DEVICE INCLUDING THE SAME

CROSS-REFERENCE TO RELATED APPLICATION

This application claims priority to Korean Patent Application No. 10-2021-0015706, filed in the Korean Intellectual Property Office on Feb. 3, 2021, and all the benefits accruing therefrom under 35 U.S.C. § 119, the content of which in its entirety is herein incorporated by reference.

BACKGROUND

1. Field

A quantum dot(s) and a composite and an electronic device including the same are disclosed.

2. Description of the Related Art

Optical properties (e.g., luminescent properties) of quantum dots (e.g., nano-sized semiconductor nanocrystals) may be controlled, for example, by controlling the sizes and compositions of the quantum dots. Luminescent properties of the quantum dots may allow for use of the quantum dots in various electronic devices (e.g., display devices). In a device, the quantum dots may have, e.g., be in, a form of a composite. It is desired to develop environmentally friendly quantum dots capable of exhibiting improved properties in a device and a quantum dot composite including the quantum dots.

SUMMARY

An embodiment provides a quantum dot that may exhibit improved luminescence properties and enhanced operation reliability for example, when being used in a form of a composite and a quantum dot composite including the same.

An embodiment provides a method of producing the quantum dots.

An embodiment provides an electronic device including the quantum dot or the quantum dot composite.

In an embodiment, a quantum dot composite includes a matrix and a plurality of quantum dots dispersed in the matrix, wherein the plurality of quantum dots include a metal including indium (In) and zinc and a non-metal including phosphorous (P), selenium, and sulfur, wherein the plurality of quantum dots includes a mole ratio of sulfur to indium of greater than or equal to about 3:1 and less than or equal to about 6:1, and a mole ratio of sulfur to selenium of greater than or equal about 0.69:1 and less than or equal to about 0.89:1, and a mole ratio of zinc to indium of greater than or equal to about 10:1 and less than or equal to about 12.4:1, and wherein the plurality of the quantum dots are configured to emit red light and wherein the quantum dot composite is configured to maintain a luminescence of less than about 103 percent (%) relative to an initial luminescence thereof when the quantum dot composite is irradiated with light having a wavelength of from about 450 nanometers (nm) to about 470 nm (for example, in a solid state) for a time period of greater than or equal to about 100 hours.

The quantum dot composite may be configured to maintain a luminescence of less than about 103% relative to an initial luminescence thereof when the quantum dot composite is irradiated with light having a wavelength of from about 450 nanometers (nm) to about 470 nm for a time period less than or equal to about 200 hours.

The relative luminance of the quantum dot composite may be less than or equal to about 102%. The relative luminance of the quantum dot composite may be less than or equal to about 101%.

The quantum dot composite may be configured to exhibit a luminance less than the initial luminance when irradiated with light having a wavelength of from about 450 nm to about 470 nm for about 30 hours or less.

A maximum peak wavelength of the red light may be greater than or equal to about 600 nm. A maximum peak wavelength of the red light may be less than or equal to about 650 nm. In an embodiment, the plurality of the quantum dots or the quantum dot composite may not include cadmium and optionally a toxic heavy metal.

In a photoluminescent spectrum of the quantum dot composite, a percentage ratio of an intensity at 570 nm relative to an intensity at a photoluminescent peak wavelength (hereinafter, a tail intensity ratio at 570 nm) may be less than or equal to about 6.5%.

The plurality of the quantum dots may include a mole ratio of sulfur to selenium of greater than or equal to about 0.75:1, or greater than or equal to about 0.83:1. The plurality of the quantum dots may include a mole ratio of sulfur to selenium of less than or equal to about 0.87:1.

The plurality of the quantum dots may include a mole ratio of sulfur to indium of greater than or equal to about 4.1:1. The plurality of the quantum dots may include a mole ratio of a mole ratio of sulfur to indium of less than or equal to about 5:1, or less than or equal to about 4.7:1.

The plurality of the quantum dots may include a mole ratio of zinc to indium of less than or equal to about 12:1, or less than or equal to about 11.8:1. The plurality of the quantum dots may include a mole ratio of zinc to indium of greater than or equal to about 10.6:1, or greater than or equal to about 10.7:1.

The plurality of the quantum dots may include a mole ratio of a total sum of sulfur and selenium to indium of greater than or equal to about 8.96:1, greater than or equal to about 9.1:1, or greater than or equal to about 9.6:1. The plurality of the quantum dots may include a mole ratio of a total sum of sulfur and selenium to indium of less than or equal to about 10.5:1, less than or equal to about 10.3:1, or less than or equal to about 10.25:1.

The plurality of the quantum dots may include a mole ratio of indium to a total sum of sulfur and selenium that is greater than or equal to about 0.096:1. The plurality of the quantum dots may include a mole ratio of indium to a total sum of sulfur and selenium that is less than or equal to about 0.109:1.

The plurality of the quantum dots may have a core shell structure including a semiconductor nanocrystal core including indium and phosphorus and a semiconductor nanocrystal shell disposed on the semiconductor nanocrystal core, the semiconductor nanocrystal shell including zinc, selenium, and sulfur.

A size, e.g., nominal size, of the plurality of the quantum dots may be less than or equal to about 8 nm. A size, e.g., nominal size, of the plurality of the quantum dots may be greater than or equal to about 7.5 nm.

The semiconductor nanocrystal shell may include a first layer including a first semiconductor nanocrystal including zinc, selenium, and optionally sulfur; and a second layer being disposed on the first layer, the second layer including a second semiconductor nanocrystal including zinc, sulfur, and optionally selenium, wherein a composition of the first semiconductor nanocrystal may be different from a composition of the second semiconductor nanocrystal.

The first layer or the first semiconductor nanocrystal may include a zinc selenide, a zinc selenide sulfide, or a combination thereof. The first layer or the first semiconductor nanocrystal may or may not include sulfur.

The second layer or the second semiconductor nanocrystal may include a zinc sulfide (e.g., may consist of ZnS). The second layer or the second semiconductor nanocrystal may or may not include selenium.

The first layer may be adjacent to (e.g., be disposed directly on) the semiconductor nanocrystal core. The first layer may have a thickness of less than or equal to about 1.8 nm. The first layer may have a thickness of greater than or equal to about 1 nm.

The second layer may be an outermost layer of the semiconductor nanocrystal shell (or the quantum dot). The second layer may have a thickness of greater than or equal to about 0.4 nm. The second layer may have a thickness of less than or equal to about 0.65 nm.

The matrix may include a polymerizable monomer including a carbon-carbon double bond, a thiol-containing compound (for example, having a, e.g., at least one, thiol group at a terminal end thereof), a polymer, a liquid vehicle (e.g., an organic solvent), or a combination thereof.

The matrix may include a polymer matrix. The polymer matrix may include a polymerization product of a monomer combination including a thiol compound having a, e.g., at least one, thiol group (for example, at a terminal end thereof) and an ene compound having a carbon-carbon unsaturated bond (e.g., a polymerizable monomer).

The quantum dot composite may be in a form of a patterned film.

The quantum dot composite may be in a solid state.

The quantum dot composite may have, e.g., exhibit, an absorption of greater than or equal to about 90%, e.g., greater than or equal to about 94%, or greater than or equal to about 95%, with respect to a blue light having a wavelength from about 450 nm to about 470 nm. The quantum dot composite may have, e.g., exhibit, a light emission of greater than or equal to about 29%, greater than or equal to about 35%, greater than or equal to about 37%, greater than or equal to about 39%, or greater than or equal to about 40%, greater than or equal to about 41%, or greater than or equal to about 42%.

In an embodiment, a color conversion panel includes the quantum dot composite (e.g., a pattern of the quantum dot composite).

The color conversion panel may include a sheet of the quantum dot composite.

In an embodiment, the color conversion panel may include a color conversion layer including a color conversion region and optionally a partition wall (such as a black matrix) defining each region of the color conversion layer (for example, capable of providing a substantially optically isolation). The color conversion region may include a first region that is configured to emit a first light, for example by irradiation of incident light and the first region may include the quantum dot composite.

The color conversion region may further include a second region emitting a second light different from the first light, for example by irradiation of incident light. The second region may include a quantum dot composite.

The color conversion panel may further include a substrate and the color conversion layer may be disposed on the substrate.

In an embodiment, a display panel includes a light emitting panel (or a light source), a color conversion panel, a light transmitting layer disposed between the light emitting panel and the color conversion panel.

In an embodiment, the quantum dots may include a metal including indium and zinc; and a non-metal including phosphorus, selenium, and sulfur, and the quantum dots include (e.g., have) a mole ratio of zinc to indium of greater than or equal to about 10:1 and less than or equal to about 12.4:1, a mole ratio of sulfur to indium of greater than or equal to about 3:1 and less than or equal to about 6:1, a mole ratio of sulfur to selenium of greater than or equal to about 0.69:1, e.g., or greater than or equal to about 0.72:1, and less than or equal to about 0.89:1. In an embodiment, the quantum dots may be configured to emit red light and a maximum peak wavelength of the red light may be greater than or equal to about 600 nm and less than or equal to about 670 nm, and in a photoluminescent spectrum, the quantum dots may exhibit a tail intensity percentage at about 570 nm of less than or equal to about 6.5%.

The tail intensity ratio may be less than or equal to about 6%, or less than or equal to about 5.6%.

The quantum dots may include a mole ratio of sulfur to selenium of greater than or equal to about 0.75:1, or greater than or equal to about 0.83:1. The quantum dots may include a mole ratio of sulfur to selenium of less than or equal to about 0.87:1.

The quantum dots may include a mole ratio of sulfur to indium of greater than or equal to about 4.1:1.

The quantum dots may include a mole ratio of sulfur to indium of less than or equal to about 5:1, or less than or equal to about 4.7:1.

The quantum dots may include a mole ratio of zinc to indium of less than or equal to about 12:1, or less than or equal to about 11.8:1. The quantum dots may include a mole ratio of zinc to indium of greater than or equal to about 10.6:1, or greater than or equal to about 10.7:1.

The quantum dots may include a mole ratio of a total sum of sulfur and selenium to indium ((S+Se):In) may be greater than or equal to about 8.96:1, greater than or equal to about 9.1:1, or greater than or equal to about 9.6:1. The quantum dots may include a mole ratio of a total sum of sulfur and selenium to indium ((S+Se):In) may be less than or equal to about 10.5:1, less than or equal to about 10.3:1, or less than or equal to about 10.25:1.

The quantum dots may include a mole ratio of indium to a total sum of sulfur and selenium (In:(S+Se)) may be greater than or equal to about 0.096:1. The quantum dots may include a mole ratio of indium to a total sum of sulfur and selenium (In:(S+Se)) may be less than or equal to about 0.109:1.

The quantum dots may have the core shell structure as described herein.

The quantum dots may have a particle size distribution (e.g., a standard deviation) of greater than or equal to about 10% and less than or equal to about 18% of an average size thereof, as determined in an electron microscopy analysis.

The quantum dots may have an average value of solidity of greater than or equal to about 0.8.

In an embodiment, a method for preparing quantum dots includes subjecting a solution including a zinc compound, an organic ligand, and an organic solvent to vacuum conditions to prepare a reaction medium including a zinc precursor; heating the reaction medium to a first temperature and adding a semiconductor nanocrystal including indium and phosphorus to the reaction medium to obtain a first mixture; heating the first mixture to a second temperature and adding a selenium precursor to the first mixture to obtain a second mixture; and maintaining a temperature of the second mixture at the second temperature and adding a sulfur precursor to prepare the quantum dots.

The quantum dots of an embodiment or the quantum dot composite of an embodiment may exhibit improved optical properties (e.g., an increased quantum efficiency together with a relatively narrow full width at half maximum). The quantum dots of an embodiment or the quantum dot composite of an embodiment may secure an improved operation reliability substantially without an overshoot phenomenon.

In an embodiment, the quantum dots and the quantum dot composite including the same may be applied to, e.g., used in, various display devices, biolabeling (biosensor, bioimaging), a photodetector, a solar cell, a hybrid composite, or the like.

BRIEF DESCRIPTION OF THE DRAWINGS

These and/or other aspects will become apparent and more readily appreciated from the following description of the embodiments, taken in conjunction with the accompanying drawings in which:

FIG. 1A shows a process of producing a quantum dot composite pattern using a composition according to an embodiment;

FIG. 6B is a cross-sectional view of a display device according to an embodiment;

DETAILED DESCRIPTION

Figure 1B:
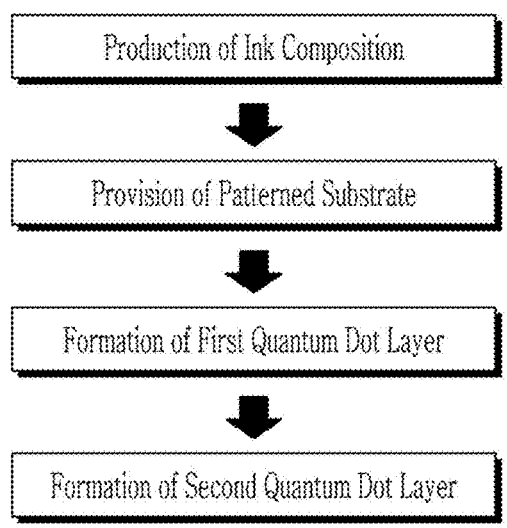
FIG. 1B shows a process of producing a quantum dot composite pattern using a composition according to an embodiment.

Advantages and characteristics of this disclosure, and a method for achieving the same, will become evident referring to the following example embodiments together with the drawings attached hereto. However, the embodiments should not be construed as being limited to the embodiments set forth herein. Rather, these embodiments are provided so that this disclosure will be thorough and complete, and will fully convey the scope of the invention to those skilled in the art. Like reference numerals refer to like elements throughout.

If not defined otherwise, all terms (including technical and scientific terms) in the specification may be defined as commonly understood by one skilled in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The terminology used herein is for the purpose of describing particular embodiments only and is not intended to be limiting. As used herein, the singular forms "a," "an," and "the" are intended to include the plural forms, including "at least one," unless the context clearly indicates otherwise. "At least one" is not to be construed as limiting "a" or "an." "Or" means "and/or." As used herein, the term "and/or" includes any and all combinations of one or more of the associated listed items. In addition, unless explicitly described to the contrary, the word "comprise" and variations such as "comprises" or "comprising" will be understood to imply the inclusion of stated elements but not the exclusion of any other elements. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or ±5% of the stated value.

It will be understood that, although the terms "first," "second," "third," etc., may be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, unless a definition is otherwise provided, the term "substituted" refers to a compound or a group or a moiety wherein a, e.g., at least one, hydrogen atom thereof is substituted with a substituent. The substituent may include a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C40 heteroaryl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group or amine group (—NRR', wherein R and R' are the same or different, and are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxylic acid group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, unless a definition is otherwise provided, the term "hetero" refers to an inclusion of at least one (e.g., one to three) heteroatom(s), wherein the heteroatom(s) is each independently N, O, S, Si, P, or a combination thereof.

As used herein, unless a definition is otherwise provided, the term "alkenyl" refers to a straight or branched chain, aliphatic hydrocarbon group having at least two carbon atoms, a valence of one, and at least one double bond, preferably one double bond.

As used herein, unless a definition is otherwise provided, the term "aliphatic hydrocarbon" refers to a C1 to C30 linear or branched alkyl group, a C2 to C30 linear or branched alkenyl group, or a C2 to C30 linear or branched alkynyl group.

As used herein, unless a definition is otherwise provided, the term "aromatic" or "aromatic hydrocarbon group" refers to a moiety having at least one aromatic ring, optionally together with one or more nonaromatic rings, formed by the removal of one or more hydrogen atoms from one or more rings of an aromatic hydrocarbon, wherein the hydrogen atom(s) may be removed from the aromatic or, if present, nonaromatic ring. One or more heteroatoms, e.g., N, P, S, O, Si, or a combination thereof may be present in one or more rings. The aromatic hydrocarbon group may be optionally substituted with one or more substituents.

As used herein, unless a definition is otherwise provided, the term "aryl group" refers to a group containing one to five aromatic rings, having a valence of one and formed by the removal of a hydrogen atom from one ring. A "heteroaryl group" refers to an aryl group wherein at least one aromatic ring carbon atom, is replaced by a heteroatom, e.g., N, P, S, O, Si, or a combination thereof. The aryl and heteroaryl groups may be optionally substituted with one or more substituents. The aryl group can be a C6 to C30 aryl group and the heteroaryl group can be a C2 to C30 heteroaryl group.

As used herein, unless a definition is otherwise provided, the term "(meth)acrylate" refers to acrylate, methacrylate, or a combination thereof. The (meth)acrylate may include a (C1 to C10 alkyl) acrylate, a (C1 to C10 alkyl) methacrylate, or a combination thereof.

As used herein, a light conversion efficiency (CE %) refers to an amount of light amount emitted from a quantum dot composite relative to an amount of light absorbed by the composite from incident light (e.g., blue light). A light emission refers to a percentage of a light emission (A) of a quantum dot composite with respect to incident light (e.g., blue light) (B). A light absorption refers to a percentage of an amount of light absorbed by a quantum dot composite with respect to an amount of incident light (e.g., blue light). The total light amount (B) of incident light may be obtained by integration of a photoluminescence (PL) spectrum of the incident light, the PL spectrum of the quantum dot-polymer composite film is measured to obtain a dose (A) of light in a green or red light wavelength region emitted from the quantum dot composite film and a dose (B') of incident light passing through the quantum dot composite film, and a photoconversion efficiency is obtained by the following equation:

$A/B \times 100\%$ = light emission (%)

$A/(B-B') \times 100\%$ = light conversion efficiency (%)

$(B-B')/B \times 100\%$ = a blue (light) absorption (%).

In an embodiment, "dispersion" may refer to a system wherein a dispersed phase is a solid and a continuous phase includes a liquid or a solid different from the dispersed phase. In an embodiment, "dispersion" refers to a colloidal dispersion wherein the dispersed phase has a dimension of greater than or equal to about 1 nm, for example, greater than or equal to about 2 nm, greater than or equal to about 3 nm, or greater than or equal to about 4 nm and several micrometers (μm) or less, (e.g., about 2 μm or less or about 1 μm or less).

As used herein, the term "average" (e.g., an average size of the quantum dot) may be mean or median. In an embodiment, the average may be "mean" average.

As used herein, "first absorption peak wavelength" refers to a wavelength of the first main peak appearing in the lowest energy region in an ultraviolet-visible absorption spectrum.

As used herein, the term "quantum dot" refers to a nanostructure (for example, a semiconductor based nanocrystal particle that exhibits quantum confinement or exciton confinement. The quantum dot is a type of light emitting nanostructure (for example capable of emitting light by an energy excitation). As used herein, unless defined otherwise, a shape of the "quantum dot" may not particularly limited.

As used herein, a dimension such as a size, a diameter, or a thickness may refer to an average dimension. The average may be a mean average or a median average value. The dimension may be determined by using an electron microscopy analysis. The dimension may be determined from the calculation taking into consideration the composition and optical properties (e.g., an ultraviolet (UV) absorption wavelength) of the quantum dots.

In an embodiment, the quantum efficiency (or quantum yield) may be measured in a solution state or a solid state (in a composite). In an embodiment, "quantum yield (or quantum efficiency)" may be a ratio of photons emitted to photons absorbed, e.g., by a nanostructure or population of nanostructures. In an embodiment, the quantum efficiency may be determined by any suitable method. For example, there may be two methods for measuring the fluorescence quantum yield or efficiency: the absolute method and the relative method. The absolute method directly obtains the quantum yield by detecting all sample fluorescence through the use of an integrating sphere. In the relative method, the fluorescence intensity of a standard sample (e.g., a standard dye) may be compared with the fluorescence intensity of an unknown sample to calculate the quantum yield of the unknown sample. Coumarin 153, Coumarin 545, Rhodamine 101 inner salt, Anthracene, and Rhodamine 6G may be used as standard dye, depending on the photoluminescence (PL) wavelengths, but are not limited thereto.

The quantum yield (QY) may be readily and reproducibly determined by using commercially available equipment, for example, from Hitachi Co. Ltd or Hamamatsu Co. Ltd and referring to the instruction manuals provided from the manufacturer.

The full width at half maximum (FWHM) and the maximum PL peak wavelength may be determined by a photoluminescent spectrum obtained by a spectrophotometer (or Fluorescence Spectrophotometer).

As used herein, the expression "not including cadmium (or other harmful heavy metal)" may refer to the case in which a concentration of cadmium (or other harmful heavy metal) may be less than or equal to about 100 parts per million by weight (ppmw), less than or equal to about 50 ppmw, less than or equal to about 10 ppmw, less than or equal to about 1 ppmw, less than or equal to about 0.1 ppmw, less than or equal to about 0.01 ppmw, or about zero. In an embodiment, substantially no amount of cadmium (or other harmful heavy metal) may be present or, if present, an amount of cadmium (or other harmful heavy metal) may be less than or equal to a detection limit or as an impurity level of a given analysis tool (e.g., an inductively coupled plasma atomic emission spectroscopy).

A semiconductor nanocrystal particle (also referred to as a quantum dot) is a nanosized crystalline material. The semiconductor nanocrystal particle may have a large surface area per unit volume due to its relatively small size, and therefore, may exhibit different characteristics from bulk materials having the same composition due to a quantum confinement effect. A quantum dot may absorb light from a light source to provide an energy excited state, and upon relaxation to the ground state emit energy corresponding to an energy bandgap of the quantum dot.

Quantum dots have potential applicability in a display device, in which the quantum dot composite may play a role of a photoconversion layer (e.g., a color conversion layer) converting incident light (e.g., a blue light) from a light source (e.g., a back light unit) into light of a desired wavelength (e.g., a green light or a red light).

In an embodiment, the photoconversion layer including the patterned quantum dot composite may be used in a luminescent type color filter in a display device. The luminescent type color filter may be disposed on a front part of the display device and for example, when the incident light passes through a liquid crystal layer to have a linearity and reaches the luminescent type color filter, it may scatter in all direction to realize a wider viewing angle and avoid light loss that can occur otherwise in an absorption type color filter.

The display device (e.g., a liquid crystal display device) including a quantum dot based luminescent color filter may further include a polarizer for example inside a panel (for example, under the color filter). The display device may further include a yellow-recycling film (YRF) for the recycle of the light and an incident light cutter such as a blue light cut filter, a green light cut filter, or a combination thereof.

The luminescent color filter or the color conversion panel (which terms may be used interchangeably) may include a pattern of quantum dot composites (or a patterned film of the quantum dot composite), and the pattern may include a first region configured to emit a first light (e.g., green light) and a second region configured to emit a second light (e.g., red light) different from the first light. The device (e.g., the display device or the display panel) including the luminescent type color filter may be operated with irradiation of incident light having a relatively short wavelength (e.g., blue light) and optionally under an elevated temperature state.

The present inventors have found that in such an operation environment of the device, the quantum dots included in the luminescent color filter may exhibit luminous properties varying over the operation time. For example, the quantum dots or the quantum dot composite emitting the first light (e.g., green light) may show, e.g., exhibit, a luminescent property varying range, e.g., variability, that is different from (a variability of) the quantum dots or the quantum dot composite emitting the second light (e.g., red light).

The present inventors have found that the red light emitting quantum dots or the quantum dot composite including the same may show, e.g., exhibit, a considerable upshift, e.g., increase, in luminous properties (such as brightness, luminous efficiency, external quantum efficiency, or a combination thereof) when exposed to incident light (e.g., blue light) for an extended period time (e.g., greater than or equal to about 10 hours, greater than or equal to about 20 hours, greater than or equal to about 30 hours, greater than or equal to about 40 hours, greater than or equal to about 50 hours and less than or equal to about 500 hours, less than or equal to about 400 hours, less than or equal to about 300 hours, less than or equal to about 200 hours, or less than or equal to about 100 hours) for example, for a time of from about 10 hours to about 500 hours, from about 50 hours to about 450 hours, from about 100 hours to about 400 hours, from about 150 hours to about 350 hours, from about 180 hours to about 300 hours, or from about 200 hours to about 250 hours), for example at room temperature (or at a predetermined temperature of greater than or equal to about 30° C., greater than or equal to about 40° C., greater than or equal to about 50° C. and less than or equal to about 70° C., less than or equal to about 60° C., or less than or equal to about 50° C.). For example, a quantum dot composite may exhibit a relative luminous property value (e.g., percentage) of, for example, greater than or equal to about 101%, greater than or equal to about 101.5%, greater than or equal to about 102%, greater than or equal to about 102.5%, or greater than or equal to about 103% during the light irradiation for about 100 hours, about 200 hours, about 250 hours, or about 300 hours, with respect to an initial value thereof.

As used herein, the upshift, e.g., increase, of the relative luminous property value may be called as "overshoot."

As the overshoot of the red light emitting quantum dots (or the quantum dot composite including the same) increases or becomes more significant, the color coordination of the device may show, e.g., exhibit, a red shift, which may increase the difficulty of controlling the color balance and the color uniformity of the device as a whole. Therefore, it is desired to develop a technology of controlling the overshoot of the (red light emitting) quantum dots in order for the display device to provide a stable and uniform picture quality. In an embodiment, the quantum dots or the quantum dot composite may emit red light and the device including the same may control the overshoot phenomenon, realizing a stable and uniform picture quality.

In an embodiment, a quantum dot composite includes a matrix and a plurality of quantum dots dispersed in the matrix, wherein the plurality of quantum dots includes a metal including indium (In) and zinc and a non-metal including phosphorous (P), selenium, and sulfur. In the plurality of quantum dots, a mole ratio of zinc to indium may be greater than or equal to about 10:1 and less than or equal to about 12.4:1. In the plurality of quantum dots, a mole ratio of sulfur to indium may be greater than or equal to about 3:1 and less than or equal to about 6:1. In the plurality of quantum dots, a mole ratio of sulfur to selenium may be greater than or equal about 0.69:1 and less than or equal to about 0.89:1. The plurality of the quantum dots are configured to emit red light. A maximum peak wavelength of the red light or a photoluminescent peak wavelength of the quantum dots may be greater than or equal to about 600 nm, greater than or equal to about 610 nm, greater than or equal to about 615 nm, greater than or equal to about 620 nm, greater than or equal to about 625 nm, greater than or equal to about 630 nm, or greater than or equal to about 635 nm. A maximum peak wavelength of the red light or a photoluminescent peak wavelength of the quantum dots may be less than or equal to about 670 nm, less than or equal to about 650 nm, less than or equal to about 645 nm, or less than or equal to about 640 nm In an embodiment, the quantum dot(s) may not include cadmium, lead, mercury, or a combination thereof. As used herein, the term "quantum dot" may refer to a single entity or a plurality of particles.

In the quantum dots, a mole ratio of sulfur to indium (S:In) may be greater than or equal to about 3:1, greater than or equal to about 3.2:1, greater than or equal to about 3.4:1, greater than or equal to about 3.6:1, greater than or equal to about 3.8:1, greater than or equal to about 4:1, greater than or equal to about 4.1:1, greater than or equal to about 4.2:1, greater than or equal to about 4.3:1, greater than or equal to about 4.4:1, greater than or equal to about 4.5:1, or greater than or equal to about 4.6:1. In the quantum dots, a mole ratio of sulfur to indium (S:In) may be less than or equal to about 6:1, less than or equal to about 5.9:1, less than or equal to about 5.8:1, less than or equal to about 5.7:1, less than or equal to about 5.6:1, less than or equal to about 5.5:1, less than or equal to about 5.4:1, less than or equal to about 5.3:1, less than or equal to about 5.2:1, less than or equal to about 5.1:1, less than or equal to about 5:1, less than or equal to about 4.9:1, or less than or equal to about 4.8:1.

In the quantum dots, a mole ratio of sulfur to selenium (Se:S) may be less than or equal to about 0.895:1, less than or equal to about 0.89:1, less than or equal to about 0.885:1, less than or equal to about 0.88:1, less than or equal to about 0.875:1, or less than or equal to about 0.87:1. In the quantum dots, a mole ratio of sulfur to selenium (Se:S) may be greater than or equal to about 0.69:1, greater than or equal to about 0.695:1, greater than or equal to about 0.70:1, greater than or equal to about 0.705:1, greater than or equal to about 0.71:1, greater than or equal to about 0.715:1, greater than or equal to about 0.72:1, greater than or equal to about 0.725:1, greater than or equal to about 0.73:1, greater than or equal to about 0.735:1, greater than or equal to about 0.74:1, greater than or equal to about 0.745:1, greater than or equal to about 0.75:1, greater than or equal to about 0.755:1, greater than or equal to about 0.76:1, greater than or equal to about 0.77:1, greater than or equal to about 0.78:1, greater than or equal to about 0.79:1, greater than or equal to about 0.8:1, greater than or equal to about 0.81:1, greater than or equal to about 0.82:1, or greater than or equal to about 0.83:1.

In the quantum dots, a mole ratio of zinc to indium (Zn:In) may be greater than or equal to about 10:1, greater than or equal to about 10.1:1, greater than or equal to about 10.2:1, greater than or equal to about 10.3:1, greater than or equal to about 10.4:1, greater than or equal to about 10.5:1, greater than or equal to about 10.6:1, greater than or equal to about 10.7:1, greater than or equal to about 10.8:1, greater than or equal to about 10.9:1, greater than or equal to about 11:1, greater than or equal to about 11.1:1, greater than or equal to about 11.2:1, greater than or equal to about 11.3:1, greater than or equal to about 11.4:1, or greater than or equal to about 11.5:1.

In the quantum dots, a mole ratio of zinc to indium (Zn:In) may be less than or equal to about 12.4:1, less than or equal to about 12.3:1, less than or equal to about 12.2:1, less than or equal to about 12.1:1, less than or equal to about 12:1, less than or equal to about 11.9:1, or less than or equal to about 11.8:1.

In the quantum dots, a mole ratio of selenium to indium (Se:In) may be greater than or equal to about 5:1, greater than or equal to about 5.1:1, greater than or equal to about 5.2:1, greater than or equal to about 5.3:1, greater than or equal to about 5.4:1. In the quantum dots, a mole ratio of selenium to indium (Se:In) may be less than or equal to about 6:1, less than or equal to about 5.9:1, less than or equal to about 5.8:1, less than or equal to about 5.7:1, or less than or equal to about 5.6:1.

In the quantum dots, a mole ratio of indium to a total sum of sulfur and selenium (In:(S+Se)) may be greater than or equal to about 0.09:1, greater than or equal to about 0.095:1, greater than or equal to about 0.097:1, or greater than or equal to about 0.0975:1. In the quantum dots, a mole ratio of indium to a total sum of sulfur and selenium (In:(S+Se)) may be less than or equal to about 0.12:1, less than or equal to about 0.115:1, less than or equal to about 0.113:1, less than or equal to about 0.111:1, less than or equal to about 0.11:1, or less than or equal to about 0.109:1.

In the plurality of the quantum dots, a mole ratio of a total sum of sulfur and selenium to indium ((S+Se):In) may be greater than or equal to about 8.96:1, greater than or equal to about 9.1:1, greater than or equal to about 9.2:1, greater than or equal to about 9.3:1, greater than or equal to about 9.4:1, greater than or equal to about 9.5:1, greater than or equal to about 9.6:1, greater than or equal to about 9.65:1, greater than or equal to about 9.7:1, greater than or equal to about 9.8:1, greater than or equal to about 9.9:1, greater than or equal to about 10:1, greater than or equal to about 10.1:1, or greater than or equal to about 10.2:1. In the plurality of the quantum dots, a mole ratio of a total sum of sulfur and selenium to indium ((S+Se):In) may be less than or equal to about 10.5:1, less than or equal to about 10.3:1, or less than or equal to about 10.25:1.

The quantum dot may include a semiconductor nanocrystal core including indium and phosphorus and a semiconductor nanocrystal shell disposed on the semiconductor nanocrystal core and including zinc, selenium, and sulfur. The quantum dot or the semiconductor nanocrystal shell may include a first shell layer disposed on the core and including zinc and selenium, and a second shell layer disposed on the first shell layer and including zinc and sulfur. In an embodiment, the quantum dot may have a core and multi-shell structure and may include a core including an indium phosphide (e.g., InP or InZnP) and a first shell including a zinc selenide (e.g., ZnSe) and a second shell including a zinc sulfide (ZnS).

In an embodiment, the semiconductor nanocrystal core may further include or may not include zinc.

The first shell layer may include a zinc selenide. The first shell layer may or may not include sulfur. The first shell layer may or may not include ZnSeS. The first layer may be disposed on the semiconductor nanocrystal core. The second shell layer may include a zinc sulfide.

The second shell layer may or may not include selenium. The second shell layer may be disposed directly on the first shell layer. The second shell layer may be the outermost layer of the semiconductor nanocrystal shell (or the quantum dot).

In an embodiment, a size (e.g., an average size) of the quantum dot(s) may be greater than or equal to about 7.5 nm, greater than or equal to about 7.6 nm, or greater than or equal to about 7.7 nm. In an embodiment, a size (e.g., an average size) of the quantum dot(s) may be less than or equal to about 8 nm, less than or equal to about 7.9 nm, or less than or equal to about 7.8 nm.

The size of the quantum dot or the average size thereof may be obtained from an electron microscopy image. The size (or the average size) may be a diameter or an equivalent diameter (or an average value thereof) obtained from the electron microscopy image. In an embodiment, the size of the quantum dot may be a nominal (calculated) size that can be calculated from a compositional analysis and a measurement of optical properties (e.g., a UV-absorption peak wavelength) of a given quantum dot. The nominal size may be calculated for a given quantum dot population from the core size and the shell thickness information obtained from the compositional analysis of the quantum dot population. The compositional analysis of the quantum dot may be made for example by using an appropriate analysis tool such as an inductively coupled plasma atomic emission spectroscopy.

The core size may be determined from a core composition of the quantum dots and an optical property (e.g., an UV absorption wavelength such as a first absorption peak wavelength). In an embodiment, for a given quantum dot, the size of the core is determined by a method using the composition of the core and an UV-Visible absorption wavelength. The method of measurement is described in Nanotechnology 24 (2013) 215201 (5 pp), the entire content of which is herein incorporated by reference.

In an embodiment, if a given quantum dot includes a core of an indium phosphide or an alloy thereof, a bandgap energy thereof is greater than or equal to about 2 electron Volts (eV) and less than or equal to about 4.8 eV and a core size may be determined in a range of greater than or equal to about 1 nm and less than or equal to about 4.5 nm. In an embodiment, quantum dots having indium phosphide based cores may have a UV absorption wavelength (e.g., the first absorption peak wavelength) of about 570 nm, the size of the core may be determined to be from about 3.5 nm to about 3.7 nm (or about 3.6 nm).

Under the assumption that a given quantum dot has a spherical shape, a shell thickness for the quantum dots may be arithmetically determined by using the following information together with the measured mole ratios of the chalcogen elements (e.g., sulfur and selenium) with respect to indium in the quantum dots:

A core size (i.e., a core diameter) and a volume of the core calculated from the core diameter; a bulk density and a molar mass of the core component (e.g., a bulk density of the indium phosphide=4.81 grams per cubic centimeter (g/cm$^3$) and a molar mass of InP=145.79 grams per mole (g/mol)); a mole number of the indium included in a given core, which is calculated from the bulk density and the molar mass of the core component; a shell volume if a ZnS or ZnSe shell having a predetermined thickness is formed on the core; and a bulk density and a molar mass of each of the shell components (for example, ZnS, ZnSe, or a combination thereof) (for example, ZnSe=5.27 g/cm$^3$ and 144.35 g/mol, ZnS=4.090 g/cm$^3$ and 97.474 g/mol).

Under an assumption of that the quantum dot is in the form of a sphere, a mole ratio of each of the chalcogen element components (for example, sulfur or selenium) of the chalcogenide shell having a predetermined thickness with respect to indium in the core having a predetermined diameter may be calculated, from which, information about a shell thickness for a given core diameter may be determined.

In an embodiment, the semiconductor nanocrystal core may include InP or InZnP. A size (or an average size) of the core(s) or a nominal size of the cores (hereinafter, simply referred to as "core size" at times) of the quantum dot(s) may be greater than or equal to about 1 nm, greater than or equal to about 1.5 nm, greater than or equal to about 2 nm, greater than or equal to about 3 nm, greater than or equal to about 3.3 nm, or greater than or equal to about 3.5 nm. In an embodiment, the core size may be less than or equal to about 5 nm, less than or equal to about 4 nm, r less than or equal to about 3.8 nm, or less than or equal to about 3.7 nm.

In an embodiment, a thickness of the shell of the quantum dot(s) or a nominal thickness thereof (hereinafter, simply referred to as "shell thickness at times) may be greater than or equal to about 1.45 nm, greater than or equal to about 1.5 nm, greater than or equal to about 1.6 nm, greater than or equal to about 1.7 nm, greater than or equal to about 1.8 nm, greater than or equal to about 1.9 nm, or greater than or equal to about 2 nm. In an embodiment, the shell thickness may be less than or equal to about 2.5 nm, less than or equal to about 2.4 nm, less than or equal to about 2.35 nm, less than or equal to about 2.3 nm, less than or equal to about 2.2 nm, or less than or equal to about 2.1 nm.

In an embodiment, a thickness of the first shell of the quantum dots (e.g., an average thickness or a nominal thickness) may be greater than or equal to about 3 monolayers (ML), for example, greater than or equal to about 3.5

ML, greater than or equal to about 3.6 ML, greater than or equal to about 3.7 ML, greater than or equal to about 3.8 ML, greater than or equal to about 3.9 ML, greater than or equal to about 4 ML, greater than or equal to about 4.1 ML, greater than or equal to about 4.2 ML, greater than or equal to about 4.3 ML, or greater than or equal to about 4.4 ML. The thickness of the first shell may be less than or equal to about 7 ML, less than or equal to about 6 ML, or less than or equal to about 5 ML. In an embodiment, the thickness of the first shell may be greater than or equal to about 0.9 nm, greater than or equal to about 1 nm, greater than or equal to about 1.1, greater than or equal to about 1.2 nm, greater than or equal to about 1.3 nm, greater than or equal to about 1.4 nm, greater than or equal to about 1.43 nm, or greater than or equal to about 1.45 nm. In an embodiment, the thickness of the first shell may be less than or equal to about 1.8 nm, less than or equal to about 1.75 nm, less than or equal to about 1.7 nm, less than or equal to about 1.6 nm, less than or equal to about 1.55 nm, or less than or equal to about 1.51 nm.

In an embodiment, a thickness of the second shell of the quantum dots (e.g., an average thickness or a nominal thickness) may be less than or equal to about 0.7 nm, less than or equal to about 0.65 nm, less than or equal to about 0.64 nm, less than or equal to about 0.63 nm, less than or equal to about 0.62 nm, less than or equal to about 0.61 nm, less than or equal to about 0.6 nm, or less than or equal to about 0.59 nm. In an embodiment, a thickness of the second shell of the quantum dots may be greater than or equal to about 0.4 nm, greater than or equal to about 0.45 nm, greater than or equal to about 0.5 nm, greater than or equal to about 0.51 nm, greater than or equal to about 0.52 nm, greater than or equal to about 0.53 nm, or greater than or equal to about 0.54 nm.

In the quantum dot composite of an embodiment, an overshoot phenomenon can be substantially suppressed or prevented. In an embodiment, the quantum dot composite may be configured to maintain a luminescence relative to an initial luminescence thereof (hereinafter, a relative luminance percentage) that is less than about 103 percent, for example, less than or equal to about 102.5%, less than or equal to about 102%, less than or equal to about 101.5%, or less than or equal to about 101%, with incident light having a wavelength of from about 450 nanometers (nm) to about 470 nm (for example, in a solid state) during a predetermined irradiation time. In an embodiment, the relative luminance percentage may be less than or equal to about 101%. In an embodiment, the irradiation time may be less than or equal to about 500 hours, less than or equal to about 450 hours, less than or equal to about 400 hours, less than or equal to about 350 hours, less than or equal to about 300 hours, less than or equal to about 250 hours, less than or equal to about 200 hours, less than or equal to about 150 hours, less than or equal to about 100 hours, less than or equal to about 80 hours, less than or equal to about 60 hours, or less than or equal to about 40 hours. In an embodiment, the irradiation time may be greater than or equal to about 20 hours, greater than or equal to about 30 hours, greater than or equal to about 40 hours, greater than or equal to about 50 hours, greater than or equal to about 60 hours, greater than or equal to about 70 hours, greater than or equal to about 80 hours, greater than or equal to about 90 hours, greater than or equal to about 100 hours, greater than or equal to about 120 hours, greater than or equal to about 150 hours, greater than or equal to about 180 hours, greater than or equal to about 200 hours, or greater than or equal to about 250 hours. The relative luminance percentage may be from about 95% to about 103%, from about 97% to about 102.5%, from about 98% to about 102%, from about 98.5% to about 101%, or a combination thereof.

The quantum dot composite may be configured to exhibit a luminance less than an initial luminance thereof on the irradiation with incident light of from about 450 nm to about 470 nm during a predetermined time period (e.g., of less than about 100 hours, less than or equal to about 80 hours, less than or equal to about 60 hours, or less than or equal to about 30 hours). In other words, the quantum dot composite may show, e.g., exhibit, a luminance decrease interval. In the luminance decrease interval, a lowest value of the relative luminance of the quantum dot composite may be less than or equal to about 99%, less than or equal to about 98%, less than or equal to about 97%, less than or equal to about 96%, or less than or equal to about 95%. In the luminance decrease interval, a lowest value of the relative luminance of the quantum dot composite may be greater than or equal to about 90%, greater than or equal to about 91%, greater than or equal to about 92%, greater than or equal to about 93%, greater than or equal to about 94%, greater than or equal to about 95%, or greater than or equal to about 96%.

In an embodiment, the quantum dots included in the quantum dot composite may show, e.g., exhibit, a photoluminescent spectrum (for example, in a dispersion liquid or in a solid state) wherein an intensity at 570 nm with respect, e.g., relative, to an intensity at a photoluminescent peak wavelength (i.e., a tail intensity ratio at 570 nm) may be less than or equal to about 6.5%, less than or equal to about 6%, less than or equal to about 5.8%, or less than or equal to about 5.7%. The tail intensity ratio at 570 nm may be greater than or equal to about 0.5%, greater than or equal to about 1.5%, greater than or equal to about 2.5%, or greater than or equal to about 3.5%.

Without wishing to be bound by any theory, it is believed that in a given red light emitting quantum dot population each having an indium phosphide core together with a zinc selenide shell and a zinc sulfide shell on the core, the shell coating state may have a substantial effect on a tail emission in a green light region in the photoluminescent spectrum of the given quantum dot population. Therefore, without wishing to be bound by any theory, it is believed that the tail emission percentage in the green light region of the photoluminescent spectrum of the quantum dot population may represent the shell coating state of the quantum dot population. Without wishing to be bound by any theory, in a given quantum dot population, if a substantial number, e.g., portion, of the quantum dots of the quantum dot population have insufficient shell coating to show, e.g., exhibit, a relatively small size, do not have a uniform shell coating, or a combination thereof, a (substantial) portion of the cores may not have a sufficient passivation, and a relatively strong light emission in a green light region of from about 550 nm to 580 nm may be exhibited. The present inventors have also found that a quantum dot population having a relatively strong tail emission intensity may be a substantial (or relatively important) cause for the overshoot phenomenon occurring during the operation of the device.

The overshoot phenomenon may be alleviated by increasing a shell coating. However, the present inventors have additionally found that a relatively thin inorganic coating may be desired for an additional improvement in the blue light absorption in the device.

In the quantum dots included in the quantum dot composite of an embodiment, a shell coating is formed under a controlled state that is set forth herein, and an unnecessary shell coating may be suppressed and a portion of the core without a shell coating may be minimized. Thus, the quantum dots of an embodiment may exhibit an improved level of coating uniformity, and the quantum dots having the composition (or mole ratios between the elements included therein) may maintain the tail emission percentage in the green light region at a relatively low degree as recited herein. The quantum dot composite including the aforementioned quantum dots may address the problems involving the overshoot while it may exhibit an improved level of incident light absorption (e.g., the blue light absorption).

In an embodiment, the quantum dot composite is in a form of film (e.g., a patterned film) and the film of the quantum dot composite may have a thickness of less than or equal to about 30 micrometer (μm), for example, less than or equal to about 25 μm, less than or equal to about 20 μm, less than or equal to about 15 μm, less than or equal to about 10 μm, less than or equal to about 8 μm, or less than or equal to about 7 μm and greater than about 2 μm, for example, greater than or equal to about 3 μm, greater than or equal to about 3.5 μm, greater than or equal to about 4 μm, greater than or equal to about 5 μm, or greater than or equal to about 6 μm.

The quantum dot composite or the film thereof may exhibit light absorption to blue light having a wavelength of about 450 nm that is greater than or equal to about 90%, greater than or equal to about 91%, greater than or equal to about 92%, greater than or equal to about 93%, greater than or equal to about 94%, or greater than or equal to about 95%. In an embodiment, the quantum dot (polymer) composite may be in a form a film having a thickness of greater than or equal to about 6 μm (e.g., about 10 μm) with an amount of the quantum dots of less than or equal to about 45%. In an embodiment, the light absorption to blue light having a wavelength of about 450 nm of the composite may be greater than or equal to about 90%, greater than or equal to about 91%, greater than or equal to about 92%, greater than or equal to about 93%, greater than or equal to about 94%, greater than or equal to about 94.5%, or greater than or equal to about 95%. The light absorption may be from about 94.5% to about 99%, from about 95% to about 98%, from about 95.5% to about 97.5%, or from about 95.7% to about 95%, or a combination thereof.

In an embodiment, the quantum dots may have a quantum efficiency (or a quantum yield) of greater than or equal to about 90%, greater than or equal to about 91%, greater than or equal to about 92%, greater than or equal to about 93%, greater than or equal to about 94%, or greater than or equal to about 95%, for example, in a liquid dispersion state or in a solid state). In an embodiment, the quantum dots may have a full width at half maximum of less than or equal to about 40 nm, less than or equal to about 39 nm, or less than or equal to about 38 nm. In the quantum dot solution, the quantum dots may be dispersed in an appropriate solvent (e.g., an organic solvent).

A shape of the quantum dots is not particularly limited, and may for example be a spherical, polyhedron, pyramid, multi-pod, or cube shape, nanotube, nanowire, nanofiber, nanosheet, or a combination thereof, but is not limited thereto.

In a quantum dot composite of an embodiment, the quantum dots may exhibit a solidity value (i.e., an average solidity of the particles) that is greater than or equal to about 0.75, greater than or equal to about 0.76, greater than or equal to about 0.77, greater than or equal to about 0.78, greater than or equal to about 0.79, or greater than or equal to about 0.8. As used herein, the term "solidity" may refer to an area of a two dimensional area of a quantum dot divided by an area of a convex hull. The convex hull may be defined as the smallest convex set of points in which a set of all points constituting a two dimensional image of a given quantum dot obtained by an electron microscopic analysis is contained. The solidity may be measured by a transmission electron microscopic analysis. For example, a computer program (e.g., an image processing program such as "image J" and its user guide v. 1.46) may be used to calculate (an average value of) solidity from a TEM image of the quantum dots.

In an electron microscopy analysis, the quantum dots may exhibit a standard deviation of less than or equal to about 18%, less than or equal to about 17%, less than or equal to about 16%, or less than or equal to about 15% of the average size thereof. In an electron microscopy analysis, the quantum dots may exhibit a standard deviation of greater than or equal to about 8%, greater than or equal to about 10%, greater than or equal to about 11%, greater than or equal to about 12%, greater than or equal to about 13%, or greater than or equal to about 14% of the average size thereof.

In an electron microscopy analysis, the quantum dot population included in the quantum dot composite may show, e.g., exhibit, a particle size distribution, wherein the number of the particles greater than the average size (for example having a size greater than the average size by at least about 5%, at least about 10%, at least about 15%, or at least about 20% of the average size) may be greater than or equal to about 10%, greater than or equal to about 20%, greater than or equal to about 25%, greater than or equal to about 27%, or greater than or equal to about 30% of a total number of particles.

The quantum dot may include an organic ligand, an organic solvent, or a combination thereof, which will be described herein, on a surface of the quantum dot. The organic ligand, the organic solvent, or a combination thereof may be bound to the surface of the quantum dot.

In an embodiment, the quantum dots (included in the quantum dot composite of an embodiment) may be prepared by a method described herein. The method includes:

vacuum-treating, e.g., subjecting to vacuum conditions, a solution including a zinc compound, an organic ligand, and an organic solvent under a controlled state (i.e., under a condition where, e.g., in which, an oxidation may be substantially suppressed or prevented) and optionally carrying out a ligand reaction to prepare a reaction medium including a zinc precursor;

heating the reaction medium at a first temperature and adding a semiconductor nanocrystal including indium and phosphorus to obtain a first mixture;

heating the first mixture at a second temperature and adding a selenium precursor and optionally a zinc precursor to conduct a reaction to obtain a second mixture; and maintaining a temperature of the second mixture at the second temperature and adding a sulfur precursor and optionally a zinc precursor to carry out a reaction to form the quantum dots.

The method may further include adding an additional selenium precursor and optionally a zinc precursor to the second mixture. In the method of an embodiment, the addition of the sulfur precursor may be made at one time for a necessary amount to obtain a desired quantum dot composition. In the method of an embodiment, the addition of the sulfur precursor may be made in a split manner (i.e., at least two times or at least three times) for a necessary amount to obtain a desired quantum dot composition.

The present inventors have found that during the preparation of the zinc precursor, it may be difficult to avoid an oxidation involving the decomposition of the zinc compound and the organic ligand even if the preparation process would be carried out under a condition of strictly controlling the oxygen (e.g., under a vacuum or a nitrogen atmosphere). In the method of producing the quantum dots of an embodiment, the zinc precursor may be prepared under a controlled state (e.g., under a condition where, e.g., in which, a side reaction such as an oxidation can be minimized, and a quality of the shell coating on the core may be improved. The relative percentage of the tail emission in the green light region as set forth herein may indicate the presence of the shell coating with an improved quality.

The present inventors have found that during the vacuum treating of the compound, the amount of the zinc compound and the treating time together with the ligand reaction condition that will be described herein may affect the activity of the zinc precursor during the shell formation reaction. In the method of an embodiment, the amount of the zinc compound to be vacuum-treated may be increased and the time for the vacuum treating may be controlled (or limited) and then under a nitrogen atmosphere, a post thermal treatment may be carried out at a temperature higher than the temperature of the vacuum treating for a controlled time, and the activity of the zinc precursor may be increased to form a shell coating with an improved quality.

In an embodiment, an amount of the zinc compound (e.g., zinc acetate) may be greater than or equal to about 3 millimoles (mmol), greater than or equal to about 5 mmol, greater than or equal to about 7 mmol, greater than or equal to about 9 mmol, greater than or equal to about 15 mmol, greater than or equal to about 20 mmol, or greater than or equal to about 50 mmol. The duration of the vacuum treating may be less than or about 50 minutes, less than or equal to about 45 minutes, less than or equal to about 40 minutes, less than or equal to about 30 minutes, less than or equal to about 25 minutes, or less than or equal to about 20 minutes. A temperature of the vacuum treating may be dependent on the amount of the precursor and may be greater than or equal to about 100° C., greater than or equal to about 110° C., greater than or equal to about 120° C., or greater than or equal to about 150° C. and less than or equal to about 200° C., or less than or equal to about 180° C.

During the ligand reaction, the zinc compound may react with the ligand to provide a zinc precursor different from the zinc compound. The temperature of the ligand reaction may be selected taking into consideration the types of the zinc compound and the organic ligand. The ligand reaction may be carried out under an inert gas atmosphere and a temperature of the ligand reaction may be greater than or equal to about 250° C., greater than or equal to about 270° C., or greater than or equal to about 280° C. and less than or equal to about 300° C., less than or equal to about 290° C., less than or equal to about 280° C., less than or equal to about 270° C., less than or equal to about 250° C., or less than or equal to about 240° C. The time for the ligand reaction may be greater than or equal to about 5 minutes, greater than or equal to about 10 minutes, greater than or equal to about 20 minutes, greater than or equal to about 30 minutes and less than or equal to about 40 minutes, less than or equal to about 30 minutes, less than or equal to about 25 minutes, less than or equal to about 10 minutes.

The first temperature (for adding the semiconductor nanocrystal particle) may be greater than or equal to about 150° C., greater than or equal to about 160° C., greater than or equal to about 170° C., greater than or equal to about 180° C., greater than or equal to about 190° C., greater than or equal to about 200° C., greater than or equal to about 210° C., greater than or equal to about 220° C., greater than or equal to about 230° C., greater than or equal to about 240° C., or greater than or equal to about 250° C. The first temperature may be less than or equal to about 330° C., less than or equal to about 320° C., less than or equal to about 310° C., less than or equal to about 300° C., or less than or equal to about 290° C.

In the method of an embodiment, the second temperature (for adding the selenium precursor) may be greater than or equal to about 300° C., greater than or equal to about 310° C., greater than or equal to about 320° C., greater than or equal to about 340° C., or greater than or equal to about 345° C. The second temperature may be less than or equal to about 380° C., less than or equal to about 370° C., less than or equal to about 360° C., less than or equal to about 350° C.

On the addition of the sulfur precursor and optionally the zinc precursor, the reaction medium may or may not include the selenium precursor. The addition of the sulfur precursor and optionally the zinc precursor may not include decreasing a temperature of the reaction medium under a temperature of less than or equal to about 50° C. (e.g., a temperature of less than or equal to about 30° C.) or to room temperature. In an embodiment, the method may not include lowering a temperature of the reaction mixture including a particle having the first shell layer of the semiconductor nanocrystal shell to less than or equal to about 100° C., for example, less than or equal to about 50° C. (e.g., 30° C. or lower, or room temperature). In other words, the method may include maintaining a temperature of a reaction mixture including the particle having the first layer on the core at a temperature of greater than or equal to about 100° C., for example, greater than or equal to 50° C., or greater than or equal to 30° C.

Without wishing to be bound by any theory, according to the method of an embodiment, the zinc precursor prepared in the aforementioned process of suppressing or controlling the oxidation reaction may initially contact (with) the selenium precursor at a temperature within the aforementioned range, and the quality of the coating including the zinc selenide may be further improved and thus even with a relatively thin shell formed on the core, the final quantum dots may show, e.g., exhibit, a substantially decreased tail emission in the green light region.

The time of the reaction for forming the shell (e.g., each of the first shell layer or the second shell layer) may be controlled taking into consideration the types of the precursor, and the composition and the structure of the final quantum dots. In the reaction for the shell formation, the reaction time may be (for example, each independently) greater than or equal to about 40 minutes, greater than or equal to about 50 minutes, greater than or equal to about 60 minutes, greater than or equal to about 70 minutes, greater than or equal to about 80 minutes, or greater than or equal to about 90 minutes. In the reaction for the shell formation, the reaction time (e.g., the reaction time for the formation of the first shell layer, the reaction time for the formation of the second shell layer, or the reaction time for the formation of each of the first shell layer and the second shell layer) may be (for example, each independently) less than or equal to about 4 hours, less than or equal to about 3 hours, or less than or equal to about 2 hours.

In the reaction medium, a concentration of the zinc precursor may not particularly limited and selected appropriately.

In the reaction (or in the first mixture, the second mixture, or each of the first mixture and the second mixture), the amounts of the zinc precursor, the selenium precursor, and the sulfur precursor with respect to the indium and the total amount used during the formation of the shell may be controlled to obtain desired compositional ratios of the elements in the final quantum dots. In each step of the process, the reaction time may be controlled to obtain desired compositional ratios of the elements and the structures (e.g., a core and multi-shell structure) in the final quantum dots.

The amount of the selenium precursor used per one mole of indium in the method or in the second mixture may be greater than or equal to about 3 moles, greater than or equal to about 4 moles, greater than or equal to about 5 moles, greater than or equal to about 6 moles, greater than or equal to about 7 moles, greater than or equal to about 8 moles, greater than or equal to about 9 moles, greater than or equal to about 10 moles, or greater than or equal to about 12 moles. The amount of the selenium used per one mole of indium in the method or in the second mixture may be less than or equal to about 25 moles, less than or equal to about 20 moles, less than or equal to about 18 moles, less than or equal to about 15 moles, less than or equal to about 12 moles, less than or equal to about 10 moles, or less than or equal to about 9 moles.

The amount of the sulfur precursor used per one mole of indium in the method may be greater than or equal to about 2 moles, greater than or equal to about 3 moles, greater than or equal to about 4 moles, greater than or equal to about 5 moles, greater than or equal to about 6 moles, greater than or equal to about 7 moles, greater than or equal to about 8 moles, greater than or equal to about 9 moles, or greater than or equal to about 10 moles. The amount of the sulfur used per one mole of indium in the method may be less than or equal to about 45 moles, less than or equal to about 40 moles, less than or equal to about 35 moles, less than or equal to about 30 moles, less than or equal to about 25 moles, less than or equal to about 20 moles, less than or equal to about 19 moles, less than or equal to about 18 moles, less than or equal to about 16 moles, less than or equal to about 15 moles, less than or equal to about 14 moles, less than or equal to about 13 moles, less than or equal to about 12 moles, less than or equal to about 11 moles, less than or equal to about 10 moles, less than or equal to about 9 moles, less than or equal to about 8 moles, less than or equal to about 7 moles, less than or equal to about 6 moles, or less than or equal to about 5 moles.

In the method of an embodiment, the amount of the zinc compound per one mole of indium may be determined taking into consideration the type of the compound and the composition of the final quantum dots. In an embodiment, the used amount of the zinc compound per one mole of indium may be greater than or equal to about 5 moles, greater than or equal to about 6 moles, greater than or equal to about 7 moles, greater than or equal to about 8 moles, greater than or equal to about 9 moles, greater than or equal to about 10 moles, greater than or equal to about 11 moles, or greater than or equal to about 12 moles. In an embodiment, the amount of the zinc compound used per one mole of indium in the method may be less than or equal to about 20 moles, less than or equal to about 19 moles, less than or equal to about 18 moles, less than or equal to about 17 moles, less than or equal to about 16 moles, less than or equal to about 15 moles, less than or equal to about 14 moles, less than or equal to about 13 moles, less than or equal to about 12 moles, less than or equal to about 11 moles, or less than or equal to about 10 moles.

The quantum dots prepared by the method of an embodiment have the aforementioned composition and aforementioned structure, having the green light tail emission substantially suppressed and addressing technological problems regarding the overshoot phenomenon in the quantum dot composite.

The type of the zinc compound is not particularly limited and may be selected appropriately. In an embodiment, the zinc compound may include a Zn metal powder, an alkylated Zn compound (e.g., dimethyl zinc, diethyl zinc, or a combination thereof), a Zn alkoxide, a Zn carboxylate (e.g., zinc acetate), a zinc carbonate, a Zn nitrate, a Zn perchlorate, a Zn sulfate, a Zn acetylacetonate, a Zn halide (e.g., zinc chloride, zinc bromide, zinc iodide, zinc fluoride, or a combination thereof), a Zn cyanide, a Zn hydroxide, a Zn oxide, a Zn peroxide, or a combination thereof. Examples of the zinc compound may include, but are not limited to dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, zinc oleate, and the like. The zinc compound may be used alone or in a combination of two or more different compounds.

The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, RHPOOH, $R_2POOH$ (wherein R and R' are the same or different, and are independently a hydrogen, a C1 to C40 (or C3 to C24) aliphatic hydrocarbon group (e.g., an alkyl group, an alkenyl group, or an alkynyl group), a C6 to C40 aromatic hydrocarbon group (such as a C6 to C20 aryl group)), a polymeric organic ligand, or a combination thereof. The organic ligand may coordinate to, e.g., be bound to, the surface of the obtained nanocrystal and help the nanocrystal to be well dispersed in the solution.

In the method of an embodiment, the ligand reaction may be carried out to provide a zinc precursor, which is a reaction product between the zinc compound and the organic ligand. In an embodiment, the reaction product may be a zinc carboxylate, a product of a reaction between the zinc compound and a C8 to C40 fatty acid. The reaction medium may include an organic solvent and the organic ligand.

The organic ligand may coordinate a surface of the prepared nanocrystal for dispersing the same in a solution. Examples of the organic ligand may include methane thiol, ethane thiol, propane thiol, butane thiol, pentane thiol, hexane thiol, octane thiol, dodecane thiol, hexadecane thiol, octadecane thiol, or benzyl thiol; methane amine, ethane amine, propane amine, butyl amine, pentyl amine, hexyl amine, octyl amine, dodecyl amine, hexadecyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; phosphine such as substituted or unsubstituted methyl phosphine (e.g., trimethyl phosphine, methyldiphenyl phosphine, etc.), substituted or unsubstituted ethyl phosphine (e.g., triethyl phosphine, ethyldiphenyl phosphine, etc.), substituted or unsubstituted propyl phosphine, substituted or unsubstituted butyl phosphine, substituted or unsubstituted pentyl phosphine, or substituted or unsubstituted octylphosphine (e.g., trioctylphosphine (TOP)); phosphine oxide such as substituted or unsubstituted methyl phosphine oxide (e.g., trimethyl phosphine oxide, methyldiphenyl phosphine oxide, etc.), substituted or unsubstituted ethyl phosphine oxide (e.g., triethyl phosphine oxide, ethyldiphenyl phosphine oxide, etc.), substituted or unsubstituted propyl phosphine oxide, substituted or unsubstituted butyl phosphine oxide, or substituted or unsubstituted octyl phosphine oxide (e.g., trioctylphosphine oxide (TOPO); diphenyl phosphine, triphenyl phosphine, diphenyl phosphine oxide, or triphenyl phosphine oxide; an alkylphosphinic acid for example, a C5 to C20 alkyl phosphinic acid (e.g., hexyl phosphinic acid, octyl phosphinic acid, dodecanyl phosphinic acid, tetradecanyl phosphinic acid, hexadecanyl phosphinic acid, octadecanyl phosphinic acid, or the like, an alkylphosphonic acid such as a C5 to C20 alkylphosphonic acid; or the like, but are not limited thereto. The organic ligand may be used alone or as a mixture of at least two different ligand compounds.

The (organic) solvent may include a C6 to C22 primary amine such as hexadecylamine; a C6 to C22 secondary amine such as dioctylamine; a C6 to C40 tertiary amine such as trioctylamine; a nitrogen-containing heterocyclic compound such as pyridine; a C6 to C40 aliphatic hydrocarbon (e.g., alkane, alkene, alkyne, etc.) such as hexadecane, octadecane, octadecene, or squalane; a C6 to C30 aromatic hydrocarbon such as phenyldodecane, phenyltetradecane, or phenyl hexadecane; a phosphine substituted with a C6 to C22 alkyl group such as trioctylphosphine; a phosphine oxide substituted with a C6 to C22 alkyl group such as trioctylphosphine oxide; a C12 to C22 aromatic ether such as phenyl ether, or benzyl ether, or a combination thereof. Types and amounts of the organic solvent may be appropriately selected taking into consideration precursors and organic ligands.

Details of the semiconductor nanocrystal core including the indium and the phosphorous are the same as set forth herein. The core may be commercially available or may be prepared in any appropriate method. The preparation of the core is not particularly limited and may be performed in any method of producing an indium phosphide based core. In an embodiment, the core may be synthesized in a hot injection manner wherein a solution including a metal precursor (e.g., an indium precursor) and optionally a ligand is heated at a high temperature (e.g., of greater than or equal to about 200° C.) and then a phosphorous precursor is injected the heated hot solution. The selenium precursor is not particularly limited and may be selected appropriately. Examples of the selenium precursor may include selenium-trioctyl phosphine (Se-TOP), selenium-tributyl phosphine (Se-TBP), selenium-triphenyl phosphine (Se-TPP), or a combination thereof but is not limited thereto.

The type of the sulfur precursor is not particularly limited and may be selected appropriately. The sulfur precursor may include hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), trimethylsilyl sulfide, sulfide ammonium, sodium sulfide, or a combination thereof. The sulfur precursor may be injected at least one time (e.g., at least two times).

After the reaction, a non-solvent is added into the obtained final reaction solution to facilitate precipitation of organic ligand-coordinated quantum dots that may then be separated. The non-solvent may be a polar solvent that is miscible with the solvent used in the reaction. The semiconductor nanocrystals and the quantum dots may not be dispersible in the non-solvent. The non-solvent may be selected depending on the solvent used in the reaction and may be for example, acetone, ethanol, butanol, isopropanol, ethanediol, water, tetrahydrofuran (THF), dimethyl sulfoxide (DMSO), diethyl ether, formaldehyde, acetaldehyde, a solvent having a similar solubility parameter to the foregoing solvents, or a combination thereof. The separation may be performed through a centrifugation, filtration, chromatography, or distillation. The separated semiconductor nanocrystals (or the first and the second semiconductor nanocrystals) may be added to a washing solvent and washed, if desired. The washing solvent is not particularly limited and may include a solvent having a similar solubility parameter to that of the organic solvent or the organic ligand, and, for example, may include an alkane such as hexane, heptane, or octane, chloroform, toluene, benzene, or the like.

The quantum dot composite of an embodiment may be prepared from a composition including the aforementioned quantum dot(s).

In an embodiment, a quantum dot composition includes the aforementioned (e.g., a plurality of) quantum dot(s); an organic solvent, a liquid vehicle, or a combination thereof; and optionally a monomer, a dispersing agent, or a combination thereof. The dispersing agent may disperse the quantum dot. The dispersing agent may include a carboxylic acid group containing compound (e.g., a monomer or a polymer). The composition may include a (photo)polymerizable monomer having a, e.g., at least one, carbon-carbon double bond, a (photo or a thermal) initiator; or a combination thereof. The composition may be a photosensitive composition.

Details of the quantum dots in the composition are as described herein. An amount of the quantum dot(s) in the composition (or a composite as described herein) may be appropriately adjusted taking into consideration a desirable final use (e.g., a photoluminescent color filter or a color conversion layer of a color conversion panel) and components of the composition (or the composite). In an embodiment, the amount of the quantum dot may be greater than or equal to about 1 weight percent (wt %), for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt %, based on a total weight or a total solids content of the composition. The amount of the quantum dot may be less than or equal to about 70 wt %, for example, less than or equal to about 65 wt %, less than or equal to about 60 wt %, less than or equal to about 55 wt %, or less than or equal to about 50 wt %, based on a total weight or a total solids content of the composition.

The weight percentage of the components relative to the total solids content in the composition may represent the contents of the components in the composite, which will be described herein. In an embodiment, the quantum dot composition may not include an organic solvent (i.e., a solventless system) and an amount of a given component in the composition may correspond to the amounts of the given component in the composite.

In the composition of an embodiment, the dispersing agent may contribute to ensuring dispersity of the quantum dots or metal oxide fine particles that will be described herein. In an embodiment, the dispersing agent may be a binder (or binder polymer). The binder may include an organic compound (e.g., a monomer or a polymer) optionally including a carboxylic acid group (e.g., in the repeating unit). The dispersing agent or the binder may be an insulating polymer.

The organic compound including a carboxylic acid group may include a copolymer of a monomer mixture including a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group;
- a multiple aromatic ring-containing polymer having a backbone structure in which two aromatic rings are bound to a quaternary carbon atom that is a constituent atom of another cyclic moiety in the main chain and including a carboxylic acid group (—COOH) (hereinafter, a cardo binder); or
- a combination thereof.

In an embodiment, the dispersing agent may include the first monomer, the second monomer, and optionally the third monomer.

In the composition, an amount of the dispersing agent or the binder polymer may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt %, based on a total weight or a total solid content of the composition, but is not limited thereto. The amount of the dispersing agent or the binder polymer may be less than or equal to about 35 wt %, for example less than or equal to about 33 wt %, or less than or equal to about 30 wt %, based on a total weight or a total solid content of the composition. The amount of the dispersing agent or the binder polymer may be about 0.5 wt % to about 55 wt %, based on a total weight or a total solid content of the composition.

In the composition, the polymerizable (e.g., photopolymerizable) monomer (hereinafter, may be referred to as "monomer") including the carbon-carbon double bond may include a (e.g., photopolymerizable) (meth)acryl-based, i.e., (meth)acryl-containing, monomer. The monomer may be a precursor for an insulating polymer.

An amount of the monomer may be greater than or equal to about 0.5 wt %, for example, greater than or equal to about 1 wt %, or greater than or equal to about 2 wt %, based on a total weight of the composition. The amount of the monomer may be less than or equal to about 30 wt %, for example, less than or equal to about 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt %, based on a total weight of the composition.

The (photo)initiator included in the composition is a compound that initiates (photo)polymerization of the aforementioned monomers in the composition. The initiator is a compound accelerating a radical reaction (e.g., radical polymerization of monomer) by producing radical chemical species under a mild condition (e.g., by heat or light). The initiator may be a thermal initiator or a photoinitiator. The initiator is not particularly limited and may be appropriately selected.

In the composition, an amount of the initiator may be appropriately adjusted taking into consideration types and amounts of the polymerizable monomers. In an embodiment, the amount of the initiator may be greater than or equal to about 0.01 wt %, for example, greater than or equal to about 1 wt % and less than or equal to about 10 wt %, for example, less than or equal to about 9 wt %, less than or equal to about 8 wt %, less than or equal to about 7 wt %, less than or equal to about 6 wt %, or less than or equal to about 5 wt %, based on a total weight (or a total weight of the solid content) of the composition, but is not limited thereto.

The composition (or the composite that will be described herein) may further include a (multiple or mono-functional) thiol compound having a, e.g., at least one, thiol group at the terminal end, a metal oxide particulate, or a combination thereof.

The metal oxide particulate may include $TiO_2$, $SiO_2$, $BaTiO_3$, $Ba_2TiO_4$, $ZnO$, or a combination thereof. In the composition, an amount of the metal oxide particulate may be greater than or equal to about 1 wt %, greater than or equal to about 5 wt %, or greater than or equal to about 10 wt % and less than or equal to about 50 wt %, less than or equal to about 40 wt %, less than or equal to about 30 wt %, less than or equal to about 25 wt %, less than or equal to about 20 wt %, less than or equal to about 15 wt %, less than or equal to about 10 wt %, or less than or equal to about 5 wt %, based on a total weight (or a solid content) of the composition. The metal oxide particulate may be non-emissive (e.g., not emitting light). The metal oxide may include an oxide of a metal or a metalloid.

The metal oxide particulate may have an appropriately selected diameter without a particular limit. The diameter of the metal oxide particulate may be greater than or equal to about 100 nm, for example, greater than or equal to about 150 nm, or greater than or equal to about 200 nm and less than or equal to about 1,000 nm or less than or equal to about 800 nm.

The multiple thiol compound may be a dithiol compound, a trithiol compound, a tetrathiol compound, or a combination thereof. For example, the thiol compound may be glycoldi-3-mercaptopropionate (e.g., ethylene glycol di-3-mercaptopropionate), glycoldimercaptoacetate (e.g., ethylene glycol dimercaptoacetate), trimethylolpropane-tris(3-mercaptopropionate), pentaerythritol tetrakis(3-mercaptopropionate), pentaerythritol tetrakis(2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

An amount of the thiol compound may be less than or equal to about 50 wt %, less than or equal to about 40 wt %, less than or equal to about 30 wt %, less than or equal to about 20 wt %, less than or equal to about 10 wt %, less than or equal to about 9 wt %, less than or equal to about 8 wt %, less than or equal to about 7 wt %, less than or equal to about 6 wt %, or less than or equal to about 5 wt %, based on a total weight or a total solid content of the composition. The amount of the thiol compound may be greater than or equal to about 0.1 wt %, for example, greater than or equal to about 0.5 wt %, greater than or equal to about 1 wt %, greater than or equal to about 5 wt %, greater than or equal to about 10 wt %, greater than or equal to about 15 wt %, greater than or equal to about 20 wt %, greater than or equal to about 25 wt %, based on a total weight or a total solid content of the composition.

The composition may further include an organic solvent (or a liquid vehicle, hereinafter referred to as a solvent). Types of the usable organic solvent are not particularly limited. Examples of the solvent may include, but are not limited to: ethyl 3-ethoxy propionate; an ethylene glycol series such as ethylene glycol, diethylene glycol, or polyethylene glycol; a glycol ether series such as ethylene glycol monomethyl ether, ethylene glycol monoethyl ether, diethylene glycol monomethyl ether, ethylene glycol diethyl ether, or diethylene glycol dimethyl ether; glycol ether acetates series such as ethylene glycol monomethyl ether acetate, ethylene glycol monoethyl ether acetate, diethylene glycol monoethyl ether acetate, or diethylene glycol monobutyl ether acetate; a propylene glycol series such as propylene glycol; a propylene glycol ether series such as propylene glycol monomethyl ether, propylene glycol monoethyl ether, propylene glycol monopropyl ether, propylene glycol monobutyl ether, propylene glycol dimethyl ether, dipropylene glycol dimethyl ether, propylene glycol diethyl ether, or dipropylene glycol diethyl ether; a propylene glycol ether acetate series such as propylene glycol monomethyl ether acetate or dipropylene glycol monoethyl ether acetate; an amide series such as N-methylpyrrolidone, dimethyl formamide, or dimethyl acetamide; a ketone series such as methyl ethyl ketone (MEK), methyl isobutyl ketone (MIBK), or cyclohexanone; a petroleum product such as toluene, xylene, or solvent naphtha; an ester series such as ethyl acetate, propyl acetate, butyl acetate, cyclohexyl acetate, or ethyl lactate; an ether such as diethyl ether, dipropyl ether, or dibutyl ether; chloroform, a C1 to C40 aliphatic hydrocarbon (e.g., alkane, alkene, or alkyne); a halogen (e.g., chloro) substituted C1 to C40 aliphatic hydrocarbon (e.g., dichloroethane, trichloromethane, or the like), a C6 to C40 aromatic hydrocarbon (e.g., toluene, xylene, or the like), a halogen (e.g., chloro) substituted C6 to C40 aromatic hydrocarbon, or a combination thereof.

Types and amounts of the solvent may be appropriately selected by taking into consideration the aforementioned main components (i.e., the quantum dot, the dispersing agent, the photopolymerizable monomer, the photoinitiator, and if used, the thiol compound), and types and amounts of additives which will be described herein. The composition may include a solvent in a residual amount except for a desired amount of the solid content (non-volatile components).

The composition (e.g., an ink jet composition) may have a viscosity at 25° C. of greater than or equal to about 4 centiPoise (cPs), greater than or equal to about 5 cPs, greater than or equal to about 5.5 cPs, greater than or equal to about 6.0 cPs, or greater than or equal to about 7.0 cPs. The composition (e.g., an ink jet composition) may have a viscosity at 25° C. of less than or equal to about 12 cPs, less than or equal to about 10 cPs, or less than or equal to about 9 cPs.

If the composition is applied in an ink jet process, the composition may be discharged onto a substrate at room temperature and may form a quantum dot polymer composite or a pattern of quantum dot polymer composite, for example, by heating. With the disclosed viscosity, the ink composition may have a surface tension at 23° C. of greater than or equal to about 21 milliNewtons per meter (mN/m), greater than or equal to about 22 mN/m, greater than or equal to about 23 mN/m, greater than or equal to about 24 mN/m, greater than or equal to about 25 mN/m, greater than or equal to about 26 mN/m, greater than or equal to about 27 mN/m, greater than or equal to about 28 mN/m, greater than or equal to about 29 mN/m, greater than or equal to about 30 mN/m, or greater than or equal to about 31 mN/m and less than or equal to about 40 mN/m, less than or equal to about 39 mN/m, less than or equal to about 38 mN/m, less than or equal to about 37 mN/m, less than or equal to about 36 mN/m, less than or equal to about 35 mN/m, less than or equal to about 34 mN/m, less than or equal to about 33 mN/m, or less than or equal to about 32 mN/m. A surface tension of the ink composition may be less than or equal to about 31 mN/m, less than or equal to about 30 mN/m, less than or equal to about 29 mN/m, or less than or equal to about 28 mN/m.

If desired, the composition may further include various additives such as a light diffusing agent, a leveling agent, or a coupling agent in addition to the aforementioned components. Details of the components of the composition may refer to for example, US-2017-0052444-A1, which will be incorporated herein by reference.

The composition according to an embodiment may be prepared by a method including preparing quantum dot dispersion including the aforementioned quantum dots, dispersing agent, and solvent; and mixing the quantum dot dispersion with the initiator, the polymerizable monomer (e.g., an acryl-based, i.e., acryl-containing, monomer), optionally, the thiol compound, optionally, the metal oxide particulates, and optionally, the aforementioned additive. Each of the aforementioned components may be mixed sequentially or simultaneously, but mixing orders are not particularly limited.

The composition according to an embodiment may be used to provide a quantum dot composite pattern (e.g., a patterned quantum dot polymer composite. The composition may provide a quantum dot-polymer composite by a (e.g., radical) polymerization. The composition according to an embodiment may be a photoresist composition including quantum dots applicable to a photolithography method. The composition according to an embodiment may be an ink composition that may provide a pattern by printing (e.g., a droplet discharge method such as inkjet printing).

In an embodiment, the quantum dot (polymer) composite includes a matrix (e.g., a polymer matrix); and the aforementioned quantum dot dispersed in the matrix. The quantum dot matrix may further include the metal oxide particulate dispersed in the matrix. The (polymer) matrix may include a linear polymer, a crosslinked polymer, or a combination thereof. The crosslinked polymer may include a thiolene resin, crosslinked poly(meth)acrylate, crosslinked polyurethane, a crosslinked epoxy resin, a crosslinked vinyl polymer, a crosslinked silicone resin, or a combination thereof. The linear polymer may include a repeating unit derived from carbon-carbon unsaturated bonds (e.g., carbon-carbon double bond). The repeating unit may include a carboxylic acid group. The linear polymer may include an ethylene repeating unit.

In a quantum dot composite of an embodiment, an amount of the plurality of quantum dots and an amount of the metal oxide fine particles are the same as set forth herein. In an embodiment, the amount of the matrix may be greater than or equal to about 10 wt %, greater than or equal to about 20 wt %, greater than or equal to about 30 wt %, greater than or equal to about 40 wt %, greater than or equal to about 50 wt %, or greater than or equal to about 60 wt %, based on a total weight of the composite. In an embodiment, the amount of the matrix may be less than or equal to about 90 wt %, less than or equal to about 80 wt %, less than or equal to about 70 wt %, less than or equal to about 60 wt %, less than or equal to about 50 wt %, or less than or equal to about 40 wt %, based on a total weight of the composite. In the composite, a total amount of the quantum dots and the metal oxide fine particles may be greater than or equal to about 10 wt %, greater than or equal to about 20 wt %, greater than or equal to about 30 wt %, greater than or equal to about 40 wt %, greater than or equal to about 50 wt %, or greater than or equal to about 60 wt %, based on a total weight of the composite. In the composite, a total amount of the quantum dots and the metal oxide fine particles may be less than or equal to about 90 wt %, less than or equal to about 80 wt %, less than or equal to about 70 wt %, less than or equal to about 60 wt %, less than or equal to about 50 wt %, less than or equal to about 40 wt %, based on a total weight of the composite.

The matrix may include a dispersing agent (e.g., a binder monomer or polymer including a carboxylic acid group), a polymerization product (e.g., insulating polymer) of a polymerizable monomer having a carbon-carbon double bond (a, e.g., at least one, for example, at least two, at least three, at least four, or at least five), optionally a polymerization product of the polymerizable monomer and a thiol compound (e.g., a polythiol compound having at least two thiol groups for example, at a terminal end thereof), or a combination thereof.

In an embodiment, the polymer matrix may include a crosslinked polymer, a linear polymer, or a combination thereof. The cross-linked polymer may include a thiolene resin, a cross-linked poly(meth)acrylate, or a combination thereof. In an embodiment, the cross-linked polymer may be a polymerization product of the polymerizable monomer and, optionally, a polythiol compound having at least two thiol groups (e.g., at a terminal end thereof). The quantum dot, the dispersing agent, or the binder polymer, the polymerizable monomer, and the polythiol compound may be the same as described herein.

In an embodiment, the color conversion panel may include the aforementioned quantum dots or the aforementioned quantum dot composite. The quantum dot composite may be in a form of a patterned film. The quantum dot composite may be in a form of a sheet.

In an embodiment, the color conversion panel may include a color conversion layer including a color conversion region and optionally a partition wall defining each region of the color conversion layer. The color conversion region (hereinafter, referred to as a repeating section at times) may include a first region (e.g., a first section) that is configured to emit a first light, for example by irradiation of incident light and the first region may include the quantum dot composite. The color conversion layer may be a patterned film of the quantum dot composite.

The color conversion region may further include a second region emitting a second light different from the first light, for example by irradiation of incident light. The second region may include a quantum dot composite. The quantum dot composite of the second region may include quantum dots capable of emitting light different from the first light (e.g., having a wavelength different from that of the quantum dot composite included in the first region).

The first light or the second light may be red light having a maximum photoluminescence peak wavelength that is between about 600 nm and about 650 nm (e.g., about 620 nm to about 650 nm), or green light having a maximum photoluminescence peak wavelength that is between about 500 nm and about 550 nm (e.g., about 510 nm to about 540 nm). The patterned film may further include a third region that may pass or emit a third light (e.g., blue light) different from the first light and the second light. The third light may include an incident light. The third light (or the excitation light) may include blue light having a maximum peak wavelength ranging from about 380 nm to about 480 nm and optionally green light.

In an embodiment, the color conversion layer or the patterned quantum dot composite film may be produced by a method using the photoresist composition. The method may include:

forming a film of the composition on a substrate (S1);
optionally prebaking the film (S2);
exposing a selected region of the film to light (e.g., a wavelength of less than or equal to about 400 nm) (S3); and
developing the exposed film with an alkali developing solution to obtain a pattern including the quantum dot-polymer composite (S4).

Non-limiting methods of forming the pattern are illustrated, referring to FIG. 1A.

The composition may be coated to have a predetermined thickness on a substrate in an appropriate method of spin coating, slit coating, and the like (S1). The formed film may be, optionally, pre-baked (PRB) (S2). The pre-baking may be performed by selecting appropriate conditions of temperature, time, atmosphere, and the like.

The formed (or optionally pre-baked) film is exposed to light having a predetermined wavelength under a mask (e.g., a photomask) having a predetermined pattern (S3). A wavelength and intensity of the light may be selected by taking into consideration the initiator (e.g., photoinitiator), an amount of the initiator (e.g., photoinitiator), the quantum dots, amounts of the quantum dots, and the like. In FIG. 1A, BM denotes a black matrix.

The exposed film is treated with an alkali developing solution (e.g., dipping or spraying) to dissolve an unexposed region and obtain a desired pattern. The obtained pattern may be, optionally, post-baked (POB) to improve crack resistance and solvent resistance of the pattern, for example, at about 150° C. to about 230° C. for a predetermined time (e.g., greater than or equal to about 10 minutes or greater than or equal to about 20 minutes) (S5).

In an embodiment in which the quantum dot-polymer composite pattern has a plurality of repeating sections, a quantum dot-polymer composite having a desired pattern may be obtained by preparing a plurality of compositions including a quantum dot having desired photoluminescence properties (a photoluminescence peak wavelength and the like) to form each repeating section (e.g., a red light emitting quantum dot, a green light emitting quantum dot, or optionally, a blue light emitting quantum dot) and an appropriate number of times (e.g., two or more times or three or more times) repeating a formation of the pattern about each composition (S6). For example, the quantum dot-polymer composite may have, e.g., be provided in, a pattern including at least two repeating color sections (e.g., RGB sections). The quantum dot-polymer composite pattern may be used as a photoluminescence-type color filter in a display device.

A quantum dot composite pattern may be formed by using an ink composition configured to form a pattern via an ink jet manner. Referring to FIG. 1B, the method includes preparing an ink composition; obtaining a substrate including a pattern of, for example, an electrode and optionally a pixel area formed by a bank; depositing an ink composition on the substrate (or the pixel area) to form a first quantum dot layer (or a first repeating section); and depositing an ink composition on the substrate (or the pixel area) to form a second quantum dot layer (or a second repeating section). Formation of the first quantum dot layer and the second quantum dot layer may be carried out simultaneously or sequentially.

Deposition of the ink composition may be carried out using an appropriate droplet discharging system such as an ink jet printer or a nozzle printing system (e.g., having an ink reservoir and a, e.g., at least one, printer head). The deposited ink composition may be heated to remove a solvent and optionally to carry out a polymerization, and thus, provide a (first or second) quantum dot layer. The method may provide a highly precise quantum dot-polymer composite film or pattern in a relatively simple way in a relatively short period of time.

The aforementioned quantum dot or quantum dot composite (pattern) may be included in an electronic device. Such an electronic device may include a display device, a light emitting diode (LED), an organic light emitting diode (OLED), a quantum dot LED, a sensor, a solar cell, an imaging sensor, a photodetector, or a liquid crystal display device, but is not limited thereto. The aforementioned quantum dots may be included in an electronic apparatus. Such an electronic apparatus may include a portable terminal device, a monitor, a notebook personal computer (PC), a television, an electronic display, a camera, an automobile, and the like, but are not limited thereto. The electronic apparatus may be a portable terminal device including a display device (or light emitting device) including quantum dots, a monitor, a notebook PC, or a television. The electronic apparatus may be a camera or a portable terminal device including an image sensor including quantum dots. The electronic apparatus may be a camera or a vehicle. The electronic apparatus may include a photodetector including the quantum dots.

The electronic device or the display device (e.g., a display panel) may further include the color conversion panel and optionally a light source or a light emitting panel. In an embodiment, the display panel include a light emitting panel (or a light source), a color conversion panel, and a light transmitting layer disposed between the light emitting panel and the color conversion panel. The color conversion panel may further include a substrate, and the color conversion layer may be disposed on a surface of the substrate.

If present, the light source or the light emitting panel may be configured to provide incident light to the luminescent element. The incident light may have a luminescence peak wavelength in a range of greater than or equal to about 440 nm, for example, greater than or equal to about 450 nm, greater than or equal to about 500 nm, or greater than or equal to about 520 nm and less than or equal to about 580 nm, for example, less than or equal to about 480 nm, less than or equal to about 470 nm, or less than or equal to about 460 nm.

Figure 2:
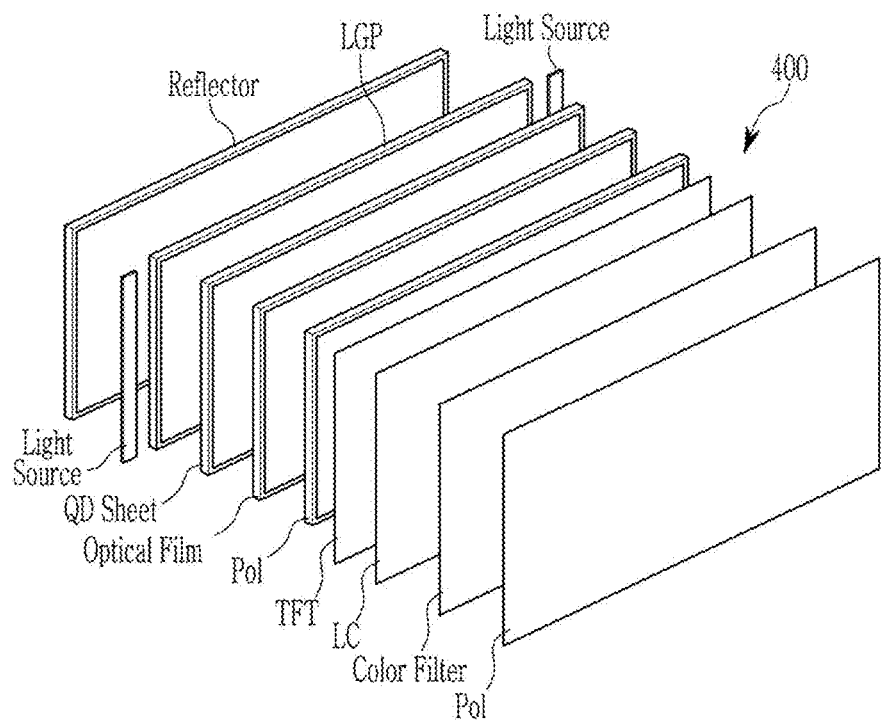
FIG. 2 is an exploded view of a display device of an embodiment.

In an embodiment, the color conversion panel or the device (e.g., a photoluminescent type device) may include a sheet of the quantum dot composite. Referring to FIG. 2, a photoluminescence type device 400 includes a backlight unit and a liquid crystal panel, and the backlight unit may include a quantum dot polymer composite sheet (QD sheet). For example, the backlight unit may include a reflector, a light guide plate (LGP), a light source (blue LED, etc.), a quantum dot polymer composite sheet (QD sheet), and optical films (prism, dual brightness enhancement film (DBEF), etc.) and the like). The liquid crystal panel may be disposed on the backlight unit and may have a structure including a thin film transistor (TFT), liquid crystal (LC), and a color filter between two polarizers (Pol). The quantum dot polymer composite sheet (QD sheet) may include quantum dots emitting red light and quantum dots emitting green light by absorbing light from a light source. Blue light from the light source may pass through the quantum dot polymer composite sheet, being combined with red light and green light emitted from quantum dots and converted to white light. The white light may be separated to blue light, green light, and red light by a color filter in the liquid crystal panel and may be emitted to the outside in each pixel.

The color conversion panel may further include a substrate and the color conversion layer may be disposed on the substrate.

In an embodiment, the color conversion layer or the color conversion panel may be disposed on a front surface (e.g., a light extraction surface) of a device (light emitting device or display device) in a form of a quantum dot (or a composite thereof) patterned film. The patterned film may include a repeating section configured to emit a desired light. The repeating section may include a first section. The first section may be a red light emitting section. The repeating section may include a second section. The second section may include a green light emitting section. The repeating section may include a third section. The third section may be a section that emits or transmits blue light. Details of the first, second, and third sections are as described herein.

The light emitting panel or the light source may be an element emitting incident light. The incident or excitation light may include blue light and, optionally, green light. The light source may include an LED. The light source may include an organic LED (OLED). On the front surface (light emitting surface) of the first section and the second section, an optical element to block (e.g., reflect or absorb) blue light (and optionally green light) for example, a blue light (and optionally green light) blocking layer or a first optical filter that will be described herein may be disposed. When the light source includes organic light emitting diode to emit blue light and an organic light emitting diode to emit green light, a green light removing filter may be further disposed on a third section through which blue light is transmitted.

The light emitting panel or the light source may include a plurality of light emitting units respectively corresponding to the first section and the second section, and the light emitting units may include a first electrode and a second electrode facing each other and an (organic) electroluminescent layer between the first electrode and the second electrode. The electroluminescent layer may include an organic light emitting material. For example, each light emitting unit of the light source may include an electroluminescent device (e.g., an organic light emitting diode (OLED)) structured to emit light of a predetermined wavelength (e.g., blue light, green light, or a combination thereof). Structures and materials of the electroluminescent device and the organic light emitting diode (OLED) are not particularly limited.

Hereinafter, a display panel and a color conversion panel will be described with reference to the drawings.

Figure 3:
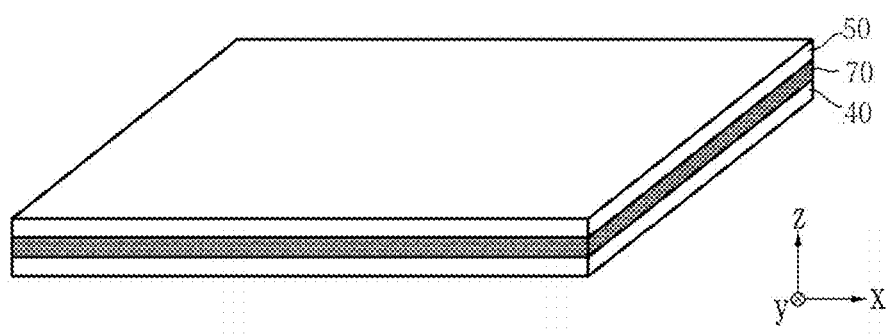
FIG. 3 is a perspective view of an embodiment of a display panel constructed according to the principles of the invention.
Figure 4:
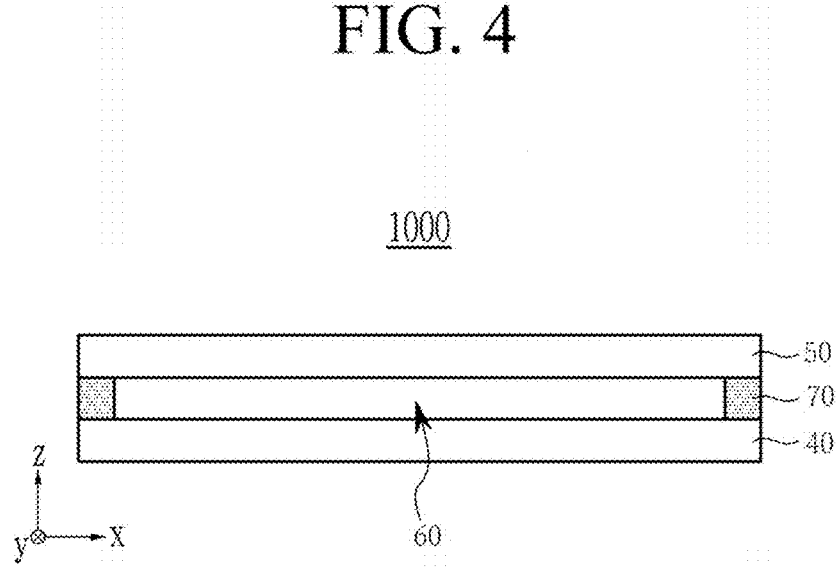
FIG. 4 is a cross-sectional view of the display panel of FIG. 3.

FIG. 3 is a perspective view of an embodiment of a display panel constructed according to the principles of the invention. FIG. 4 is a cross-sectional view of the display panel of FIG. 3. Referring to FIGS. 3 and 4, the display panel 1000 according to an embodiment includes a light emitting panel 40, a color conversion panel 50, a light transmitting layer 60 disposed between the light emitting panel 40 and the color conversion panel 50, and a binding material 70 binding the light emitting panel 40 and the color conversion panel 50.

The light emitting panel 40 and the color conversion panel 50 face each other leaving the light transmitting layer 60 therebetween, and the color conversion panel 50 is disposed in a direction where, e.g., in which, light emits from the light emitting panel 40. The binding material 70 is disposed along edges of the light emitting panel 40 and the color conversion panel 50, and may be, for example, a sealing material.

Figure 5:
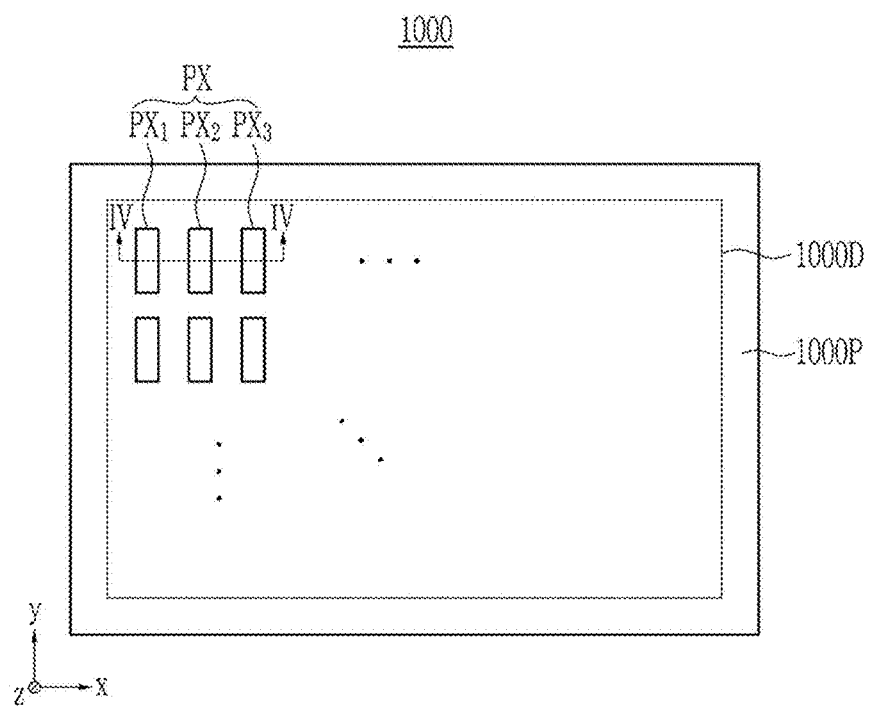
FIG. 5 is a plan view of an embodiment of a pixel arrangement of the display panel of FIG. 3.

FIG. 5 is a plan view of an embodiment of a pixel arrangement of the display panel of an embodiment. Referring to FIG. 5, the display panel 1000 includes a display area 1000D displaying an image and a non-display area 1000P positioned in a peripheral area of the display area 1000D and disposed with a binding material 70.

The display area 1000D includes a plurality of pixels PX arranged along with a row (e.g., x direction), column (e.g., y direction), or a combination thereof, and each representative pixel PX includes a plurality of sub-pixels $PX_1$, $PX_2$, and $PX_3$ expressing, e.g., displaying, different colors from each other. An embodiment is exemplified with a structure in which three sub-pixels $PX_1$, $PX_2$, and $PX_3$ are configured to provide a pixel. An embodiment may further include an additional sub-pixel such as a white sub-pixel and may further include a, e.g., at least one, sub-pixel expressing, e.g., displaying the same color. The plurality of pixels PX may be aligned, for example, in a Bayer matrix, a matrix sold under the trade designation PenTile, a diamond matrix, or a combination thereof.

Each of sub-pixels $PX_1$, $PX_2$, and $PX_3$ may express, e.g., display, three primary colors or a color of a combination of three primary colors, for example, may express, e.g., display, a color of red, green, blue, or a combination thereof. For example, the first sub-pixel $PX_1$ may express, e.g., display, red, and the second sub-pixel $PX_2$ may express, e.g., display, green, and the third sub-pixel $PX_3$ may express, e.g., display, blue.

In the drawing, all sub-pixels are exemplified to have the same size, but at least one of the sub-pixels may be larger or smaller than other sub-pixels. In the drawing, all sub-pixels are exemplified to have the same shape, but at least one of the sub-pixels may have different shape from other sub-pixels.

Figure 6A:
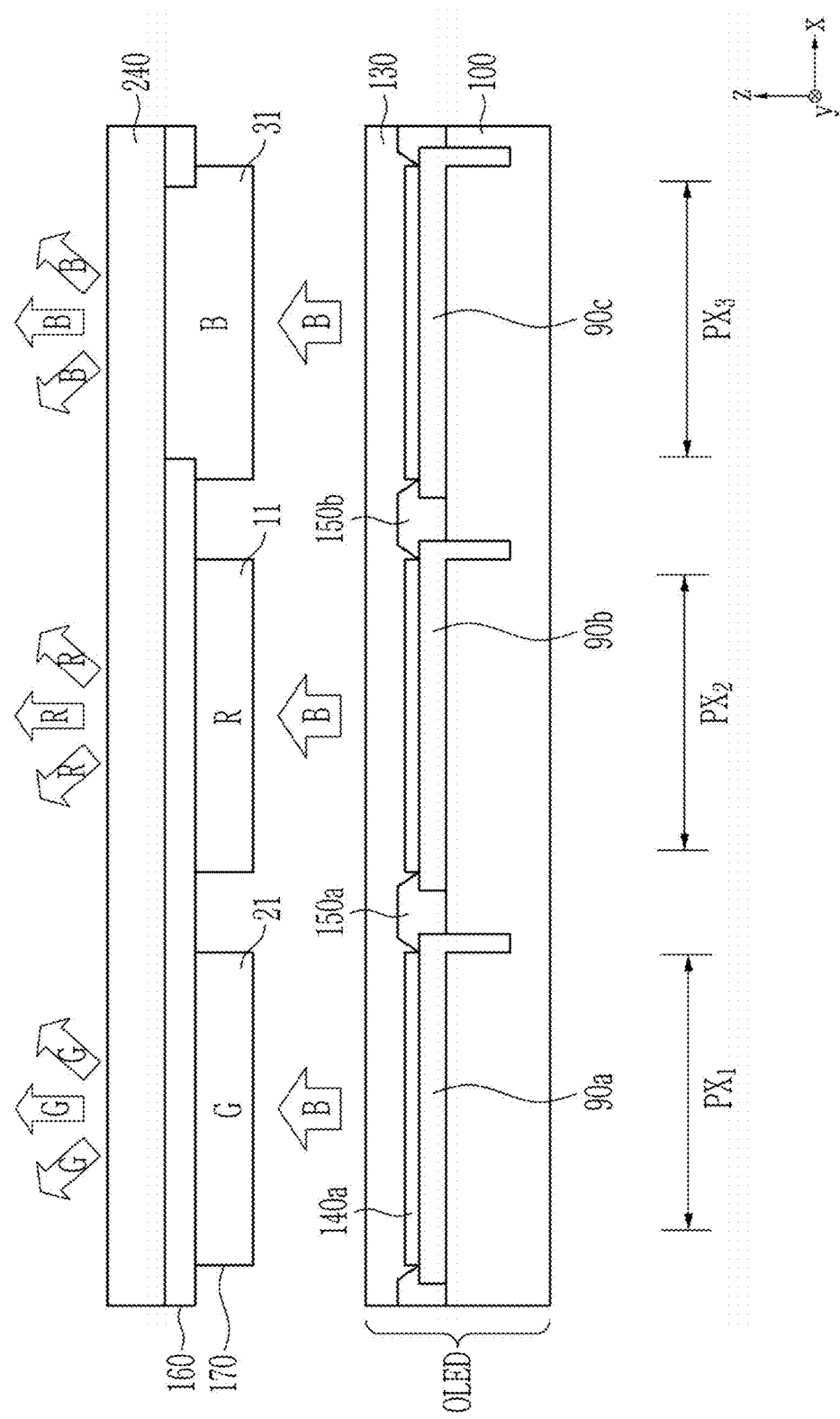
FIG. 6A is a cross-sectional view taken along line IV-IV (as shown in FIG. 5) of the display panel of FIG. 3.

FIG. 6A is a schematic cross-sectional view of a display device according to an embodiment and FIG. 6B is a schematic cross-sectional view of a display device according to an embodiment. Referring to FIGS. 6A and 6B, the light source includes an organic light emitting diode (OLED) that emits blue (B) light (and optionally green light). The organic light emitting diode (OLED) may include at least two pixel electrodes 90*a*, 90*b*, 90*c* formed on the substrate 100, a pixel define layer 150*a*, 150*b* formed between the adjacent pixel electrodes 90*a*, 90*b*, 90*c*, an organic light emitting layer 140*a*, 140*b*, 140*c* formed on each pixel electrode 90*a*, 90*b*, 90*c*, and a common electrode layer 130 formed on the organic light emitting layer 140*a*, 140*b*, 140*c*. A thin film transistor and a substrate may be disposed under the organic light emitting diode (OLED). Pixel areas of the OLED may be disposed corresponding to the first, second, and third sections.

A laminated structure including the quantum dot composite pattern 170 (e.g., a first section 11 or R including red light emitting quantum dots, a second section 21 or G including green light emitting quantum dots, and a third section 31 or B including or not including a quantum dot, e.g., a blue light emitting quantum dot) pattern and substrate 240 may be disposed on the light source. The blue light emitted from the light source enters the first section and second section and may emit red light and green light, respectively. The blue light emitted from the light source may pass through the third section. An element (first optical filter 160 or excitation light blocking layer) configured to block the excitation light may be disposed between the quantum dot composite layers R and G and the substrate, as desired. When the excitation light includes blue light and green light, a green light blocking filter may be added to the third section. The first optical filter or the excitation light blocking layer will be described in more detail herein.

Such a (display) device may be produced by separately producing the aforementioned laminated structure and LED or OLED (e.g., emitting blue light) and then combining the laminated structure and LED or OLED. The (display) device may be produced by directly forming the quantum dot composite pattern on the LED or OLED.

The substrate may be a substrate including an insulation material. The substrate may include glass; various polymers such as a polyester, (e.g., polyethylene terephthalate (PET), polyethylene naphthalate (PEN), and the like), polycarbonate, and polyacrylate; a polysiloxane (e.g., polydimethylsiloxane (PDMS)); an inorganic material such as $Al_2O_3$ or ZnO; or a combination thereof, but is not limited thereto. A thickness of the substrate may be appropriately selected taking into consideration a substrate material but is not particularly limited. The substrate may have flexibility. The substrate may have a transmittance of greater than or equal to about 50%, greater than or equal to about 60%, greater than or equal to about 70%, greater than or equal to about 80%, or greater than or equal to about 90% for light emitted from the quantum dots.

A wire layer including a thin film transistor or the like is formed on the substrate. The wire layer may further include a gate line, a sustain voltage line, a gate insulating layer, a data line, a source electrode, a drain electrode, a semiconductor, a protective layer, and the like. The detailed structure of the wire layer may vary depending on an embodiment. The gate line and the sustain voltage line are electrically separated from each other, and the data line is insulated and crossing the gate line and the sustain voltage line. The gate electrode, the source electrode, and the drain electrode form a control terminal, an input terminal, and an output terminal of the thin film transistor, respectively. The drain electrode is electrically connected to the pixel electrode that will be described herein.

The pixel electrode may function as an electrode (e.g., anode) of the display device. The pixel electrode may be formed of a transparent conductive material such as indium tin oxide (ITO) or indium zinc oxide (IZO). The pixel electrode may be formed of a material having a light-blocking properties such as gold (Au), platinum (Pt), nickel (Ni), tungsten (W), chromium (Cr), molybdenum (Mo), iron (Fe), cobalt (Co), copper (Cu), palladium (Pd), or titanium (Ti). The pixel electrode may have a two-layered structure in which the transparent conductive material and the material having light-blocking properties are laminated sequentially.

Between two adjacent pixel electrodes, a pixel define layer (PDL) overlapped with a terminal end of the pixel electrode to divide the pixel electrode into a pixel unit. The pixel define layer is an insulation layer which may electrically block the at least two pixel electrodes.

The pixel define layer covers a portion of the upper surface of the pixel electrode, and the remaining region of the pixel electrode not covered by the pixel define layer may provide an opening. An organic light emitting layer that will be described herein may be formed in the region defined by the opening.

The organic light emitting layer defines each pixel area by the aforementioned pixel electrode and the pixel define layer. In other words, one pixel area may be defined as an area formed with one organic light emitting unit layer which is contacted with one pixel electrode divided by the pixel define layer. In the display device according to an embodiment, the organic light emitting layer may be defined as a first pixel area, a second pixel area and a third pixel area, and each pixel area is spaced apart from each other leaving a predetermined interval by the pixel define layer.

In an embodiment, the organic light emitting layer may emit a third light belonging to a visible light region or belonging to an ultraviolet (UV) region. Each of the first to the third pixel areas of the organic light emitting layer may emit a third light. In an embodiment, the third light may be a light having the highest energy in the visible light region, for example, may be blue light (and optionally green light). When all pixel areas of the organic light emitting layer are designed to emit the same light, each pixel area of the organic light emitting layer may be all formed of the same or similar materials or may show, e.g., exhibit, the same or similar properties. Thus a process of forming the organic light emitting layer may be simplified, and the display device may be easily applied for, e.g., made by, a large scale/large area process. However, the organic light emitting layer according to an embodiment is not necessarily limited thereto, but the organic light emitting layer may be designed to emit at least two different lights, e.g., at least two different colored lights.

The organic light emitting layer includes an organic light emitting unit layer in each pixel area, and each organic light emitting unit layer may further include an auxiliary layer (e.g., hole injection layer, hole transport layer, electron transport layer, etc.) besides the light emitting layer.

The common electrode may function as a cathode of the display device. The common electrode may be formed of a transparent conductive material such as indium tin oxide (ITO) or indium zinc oxide (IZO). The common electrode may be formed on the organic light emitting layer and may be integrated therewith.

A planarization layer or a passivation layer (not shown) may be formed on the common electrode. The planarization layer may include a (e.g., transparent) insulating material for ensuring electrical insulation with the common electrode.

In an embodiment, the display device may further include a lower substrate, a polarizing plate disposed under the lower substrate, and a liquid crystal layer disposed between the laminated structure and the lower substrate, and in the laminated structure, the photoluminescence layer (i.e., light emitting layer) may be disposed to face the liquid crystal layer. The display device may further include a polarizing plate between the liquid crystal layer and the light emitting layer. The light source may further include LED and if desired, a light guide plate.

Figure 7:
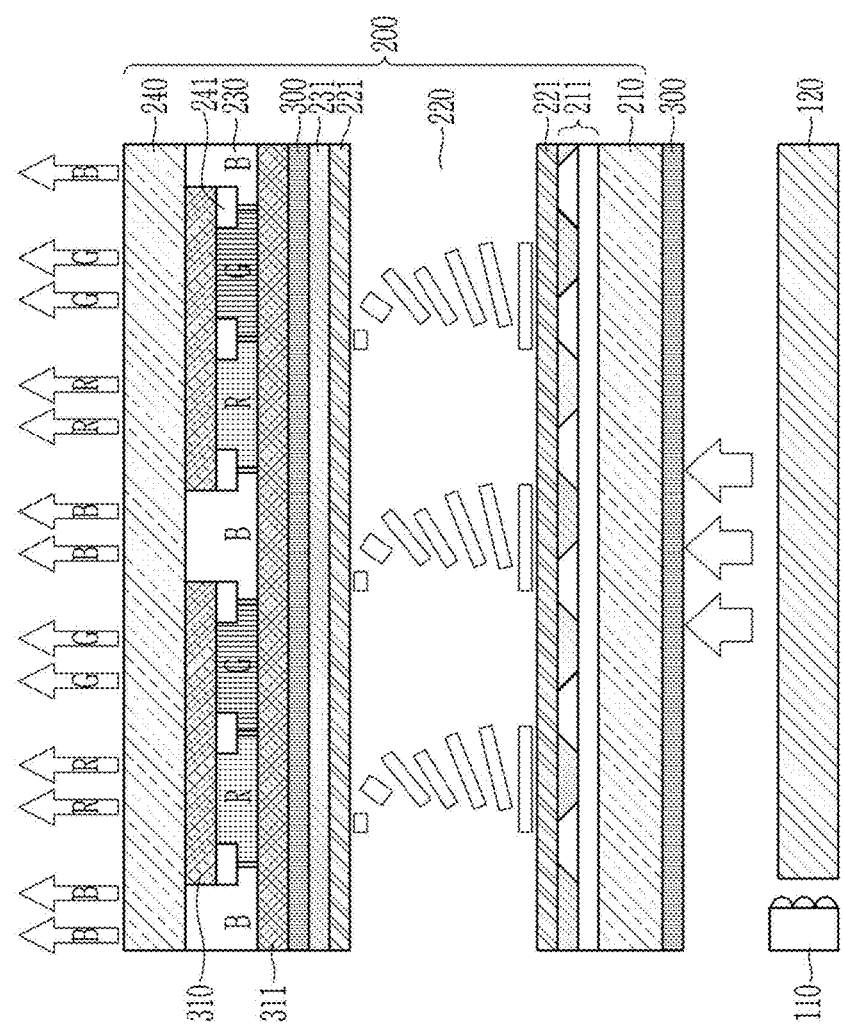
FIG. 7 is a cross-sectional view of a display device according to an embodiment.

Non-limiting examples of the display device (e.g., a liquid crystal display device) according to an embodiment are illustrated with a reference to a drawing. FIG. 7 is a schematic cross sectional view showing a liquid crystal display according to an embodiment. Referring to FIG. 7, the display device of an embodiment includes a liquid crystal panel 200, a polarizing plate 300 disposed under the liquid crystal panel 200, and a backlight unit disposed under the polarizing plate 300.

The liquid crystal panel 200 includes a lower substrate 210, a stack structure, and a liquid crystal layer 220 disposed between the stack structure and the lower substrate. The stack structure includes a transparent substrate 240, a first optical filter layer 310, a photoluminescent layer 230 including a pattern of a quantum dot polymer composite, and a second optical filter layer 311.

The lower substrate 210 referred to as an array substrate may be a transparent insulation material substrate. The substrate is the same as described herein. A wire plate 211 is provided on an upper surface of the lower substrate 210. The wire plate 211 may include a plurality of gate wires (not shown) and data wires (not shown) that define a pixel area, a thin film transistor disposed adjacent to a crossing region of gate wires and data wires, and a pixel electrode for each pixel area, but is not limited thereto. Details of such a wire plate are not particularly limited.

The liquid crystal panel 200 may include an alignment layer 221 on and under the liquid crystal layer 220 to initially align the liquid crystal material included therein. Details (e.g., a liquid crystal material, an alignment layer material, a method of forming liquid crystal layer, a thickness of liquid crystal layer, or the like) of the liquid crystal layer and the alignment layer are not particularly limited.

A lower polarizing plate 300 is provided under the lower substrate 210. Materials and structures of the polarizing plate 300 are not particularly limited. A backlight unit (e.g., emitting blue light) may be disposed under the polarizing plate 300. An upper optical element or the polarizing plate 300 may be provided between the liquid crystal layer 220 and the transparent substrate 240, but is not limited thereto. For example, the upper polarizing plate may be disposed between the liquid crystal layer 220 and the photoluminescent layer 230. The polarizing plate may be any suitable polarizer that used in a liquid crystal display device. The polarizing plate may be TAC (triacetyl cellulose) having a thickness of less than or equal to about 200 μm, but is not limited thereto. In an embodiment, the upper optical element may be a coating that controls a refractive index without a polarization function.

The backlight unit includes a light source 110. The light source 110 may emit blue light or white light. The light source 110 may include a blue LED, a white LED, a white OLED, or a combination thereof, but is not limited thereto.

The backlight unit may further include a light guide plate 120. In an embodiment, the backlight unit may be an edge-type lighting. For example, the backlight unit may include a reflector (not shown), a light guide plate (not shown) provided on the reflector and providing a planar light source to the liquid crystal panel 200, a, e.g., at least one, optical sheet (not shown) on the light guide plate, for example, a diffusion plate, a prism sheet, and the like, or a combination thereof, but is not limited thereto. The backlight unit may not include a light guide plate. In an embodiment, the backlight unit may be a direct lighting. For example, the backlight unit may have a reflector (not shown), and may have a plurality of fluorescent lamps disposed on the reflector at regular intervals, or may have an LED operating substrate on which a plurality of light emitting diodes may be disposed, a diffusion plate thereon, and optionally a, e.g., at least one, optical sheet. Details (e.g., each component of a light emitting diode, a fluorescent lamp, a light guide plate, various optical sheets, and a reflector) of such a backlight unit are not particularly limited.

A black matrix 241 is provided under the transparent substrate 240 and has openings and hides a gate line, a data line, and a thin film transistor of the wire plate on the lower substrate. For example, the black matrix 241 may have a lattice shape. The photoluminescent layer 230 is provided in the openings of the black matrix 241 and has a quantum dot composite pattern including a first section (R) configured to emit a first light (e.g., red light), a second section (G) configured to emit a second light (e.g., green light), and a third section (B) configured to emit/transmit, for example blue light. If desired, the photoluminescent layer 230 may further include a, e.g., at least one, fourth section. The fourth section may include a quantum dot that emits a light of different color from light emitted from the first to third sections (e.g., cyan, magenta, and yellow light).

In the photoluminescent layer 230, sections forming the pattern may be repeated corresponding to pixel areas formed on the lower substrate 210. A transparent common electrode 231 may be provided on the photoluminescent type color filter layer.

The third section (B) configured to emit/transmit blue light may be a transparent color filter that does not change an emission spectrum of the light source. Blue light emitted from the backlight unit may enter in a polarized state and may be emitted through the polarizing plate and the liquid crystal layer as is. If desired, the third section may include a quantum dot emitting blue light.

As described herein, if desired, the display device or light emitting device of an embodiment may further have an excitation light blocking layer or a first optical filter layer (hereinafter referred to as a first optical filter layer). The first optical filter layer may be disposed between the bottom surface of the first section (R) and the second section (G) and the substrate (e.g., the upper substrate 240) or on the upper surface of the substrate. The first optical filter layer 310 may be a sheet having an opening in a region corresponding to a pixel area (a third section) displaying blue and thus formed in a region corresponding first and second sections. The first optical filter layer may be disposed at the positions except the position overlapped with the third section and integrally therewith as shown in FIGS. 6A, 6B, and FIG. 7, but is not limited thereto. For example, at least two first optical filter layers may be disposed leaving a space at each position overlapped with the first and second sections. When the light source includes a green light emitting element, a green light blocking layer may be disposed on the third section.

The first optical filter layer may block (e.g., absorb) or substantially block light having, for example, a predetermined wavelength region in the visible light region and may transmit light in the other wavelength regions, and for example, the first optical filter layer may block blue light (or green light) and may transmit light except the blue light (or green light). The first optical filter layer may transmit, for example, green light, red light, and/or yellow light which is a mixed color thereof.

The first optical filter layer may substantially block excitation light and transmit light in a desired wavelength range. The transmittance of the first optical filter layer for the light in a desired wavelength range may be greater than or equal to about 70%, greater than or equal to about 80%, greater than or equal to about 90%, or even about 100%.

The first optical filter layer configured to selectively transmit red light may be disposed at a position overlapped with the red light emission section, and the first optical filter layer configured to selectively transmit green light may be disposed at a position overlapped with the green light emission section. The first optical filter layer may include a first region that blocks (e.g., absorb) blue light and red light and selectively transmits light of a predetermined range (e.g., greater than or equal to about 500 nm, greater than or equal to about 510 nm, or greater than or equal to about 515 nm and less than or equal to about 550 nm, less than or equal to about 545 nm, less than or equal to about 540 nm, less than or equal to about 535 nm, less than or equal to about 530 nm, less than or equal to about 525 nm, or less than or equal to about 520 nm); a second region that blocks (e.g., absorb) blue light and green light and selectively transmits light of a predetermined range (e.g., greater than or equal to about 600 nm, greater than or equal to about 610 nm, or greater than or equal to about 615 nm and less than or equal to about 650 nm, less than or equal to about 645 nm, less than or equal to about 640 nm, less than or equal to about 635 nm, less than or equal to about 630 nm, less than or equal to about 625 nm, or less than or equal to about 620 nm); or a combination thereof. When the light source emits blue and green mixed light, the first optical filter may further include a third region that selectively transmits blue light and blocks green light.

The first region may be disposed at a position overlapped with the green light emitting section. The second region may be disposed at a position overlapped with the red light emitting section. The third region may be disposed at a position overlapped with the blue light emitting section.

The first region, the second region, and, optionally, the third region may be optically isolated. Such a first optical filter layer may contribute to improvement of color purity of the display device.

The display device may further include a second optical filter layer (e.g., a red/green or yellow light recycle layer) 311 disposed between the photoluminescent layer and the liquid crystal layer (e.g., the photoluminescent layer and the upper polarizing plate, e.g., polarizer), transmitting at least a portion of third light (excitation light), and reflecting a, e.g., at least one, part of the first light, part of the second light, or part of each of the first light and second light. The first light may be red light, the second light may be green light, and the third light may be blue light. For example, the second optical filter layer may transmit only the third light (B) in a blue light wavelength region having a wavelength region of less than or equal to about 500 nm and light in a wavelength region of greater than about 500 nm, which is green light (G), yellow light, red light (R), or the like, may be not passed through the second optical filter layer and reflected. The reflected green light and red light may pass through the first and second sections and to be emitted to the outside of the display device.

The second optical filter layer or the first optical filter layer may be formed as an integrated layer having a relatively planar surface.

The first optical filter layer may include a polymer thin film including a dye absorbing light in a wavelength which is to be blocked, a pigment absorbing light in a wavelength which is to be blocked, or a combination thereof. The second optical filter layer and the first optical filter layer may include a single layer having a low refractive index, and may be, for example, a transparent thin film having a refractive index of less than or equal to about 1.4, less than or equal to about 1.3, or less than or equal to about 1.2. The second optical filter layer or the first optical filter layer having a low refractive index may be, for example, a porous silicon oxide, a porous organic material, a porous organic/inorganic composite, or a combination thereof.

The first optical filter layer or the second optical filter layer may include a plurality of layers having different refractive indexes. The first optical filter layer or the second optical filter layer may be formed by laminating two layers having different refractive indexes. For example, the first/second optical filter layer may be formed by alternately laminating a material having a high refractive index and a material having a low refractive index.

Hereinafter, the embodiments are illustrated in more detail with reference to examples. However, they are exemplary embodiments of the present invention, and the present invention is not limited thereto.

EXAMPLES

Analysis Methods

1. Ultraviolet (UV)-Visible (Vis) Absorption Analysis

An Agilent Cary5000 spectrometer is used to obtain and perform UV-Visible absorption spectrum and analysis.

2. Photoluminescence (PL) Analysis

Photoluminescence spectrum and analysis is performed using a Hitachi F-7000 spectrometer.

3. Inductively Coupled Plasma-Atomic Emission Spectroscopy (ICP-AES) Analysis

An inductively coupled plasma-atomic emission spectroscopy (ICP-AES) analysis is performed using Shimadzu ICPS-8100.

4. Blue Light Absorption and Light Conversion of Composite

An integral hemisphere of a measurement equipment (QE-2100, Otsuka) is used to measure a light dose (B) of blue excitation light having a predetermined wavelength. Subsequently, a quantum dot polymer composite is put in the integral hemisphere and irradiated by the blue excitation light to measure a red light dose (A) and a blue light dose (B') irradiating out from the composite.

The measurements are used to obtain a blue light absorption and a light conversion according to the following equations.

Blue light absorption (%)=((B−B')/B)×100(%)

Light conversion (%)=(A/B)×100(%).

5. Transmission Electron Microscopy (TEM) Analysis

A TEM analysis is conducted using UT F30 Tecnai electron microscope.

6. Operation Reliability Test

An operation reliability is evaluated using 1,500 nit (candelas per square meter) backlight unit (BLU) as a light source (wavelength: 450 nm) in air at a temperature of 60° C.

Reference Example 1

Indium acetate and palmitic acid are dissolved in 1-octadecene in a 200 milliliters (mL) reaction flask, and the solution is subjected to a vacuum state at 120° C. for one hour. A molar ratio of indium to palmitic acid of 1:3 is used. The atmosphere in the flask is exchanged with $N_2$, and the flask is heated to 280° C. A mixed solution of tris(trimethylsilyl)phosphine ($TMS_3P$) and trioctylphosphine (TOP) is quickly injected, and the reaction proceeds for a predetermined time (e.g., for about 20 minutes). The reaction mixture is rapidly cooled to room temperature, and acetone is added to facilitate the precipitation of nanocrystals, which are then separated by centrifugation and dispersed in toluene to obtain a toluene dispersion of the InP core nanocrystals. The amount of the $TMS_3P$ added to the reaction flask is about 0.5 moles per one mole of indium. The amount of the trioctylphosphine added to the reaction flask is about 0.1 moles to about 10 moles (e.g., about 0.5 moles) per one mole of indium. An average particle size of the InP core is about 3.6 nanometers (nm).

Example 1

1. Synthesis of the Quantum Dots and Characterization Thereof

Selenium and sulfur are dispersed in trioctylphosphine (TOP) to obtain a Se/TOP stock solution and a S/TOP stock solution, respectively.

In a 200 mL reaction flask, 7.2 mmol of zinc acetate and oleic acid are dissolved in trioctyl amine and the solution is subjected to vacuum at 120° C. for 30 minutes, then is heated under a nitrogen atmosphere to 280° C. for 10 minutes to prepare a reaction medium including a zinc precursor.

The reaction medium including the zinc precursor is cooled to about 180° C. and a toluene dispersion of the prepared InP semiconductor nanocrystal core is injected into the reaction medium, which is then heated to 320° C. and the Se/TOP stock solution and optionally an additional zinc precursor are added to the reaction flask. A reaction is carried out for about 30 minutes. Then, the S/TOP stock solution and an additional zinc precursor prepared separately in the same manner as disclosed herein are injected to the reaction mixture and a reaction is carried out for about 60 minutes and the resulting mixture is cooled rapidly to room temperature.

A total amount of each of the Se precursor, the S precursor, and the zinc precursor as used per one mole of the indium is controlled so that the final quantum dot has the composition set forth in Table 2.

An excess amount of ethanol is added to the reaction mixture including the final quantum dots, and the mixture is centrifuged. After centrifugation, the supernatant is discarded and the precipitate is dried and dispersed in chloroform or toluene to obtain a quantum dot solution (hereinafter, QD solution).

Figure 8A:
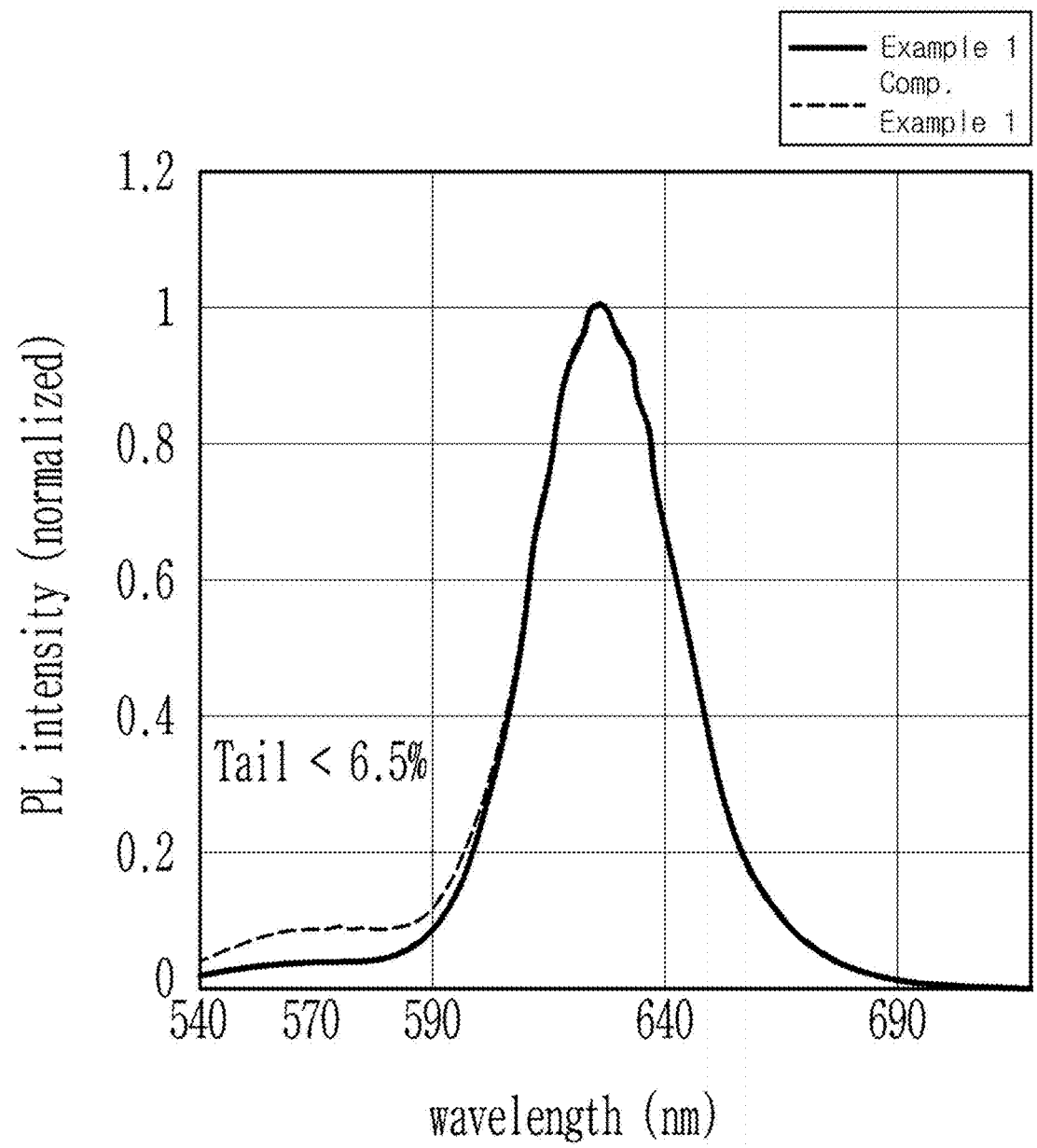
FIG. 8A is a graph of photoluminescence (PL) intensity (normalized) versus wavelength (nm) showing photoluminescent spectrums of the quantum dots prepared in Example 1 and the quantum dots prepared in Comparative Example 1, respectively.
Figure 8B:
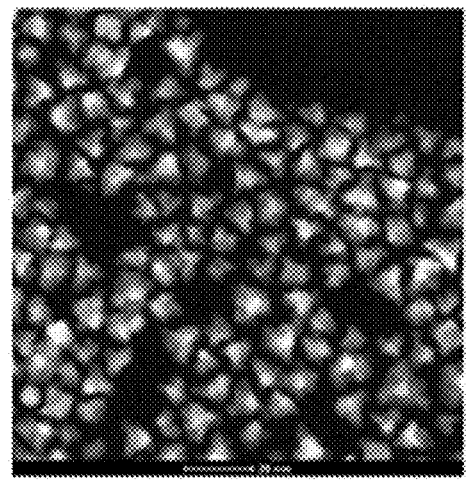
FIG. 8B shows the electron microscopy analysis results for the quantum dots prepared in Example 1, including a Transmission Electron Microscopy (TEM) image and a graph of number of particles versus diameter (nm)
Figure 8B:
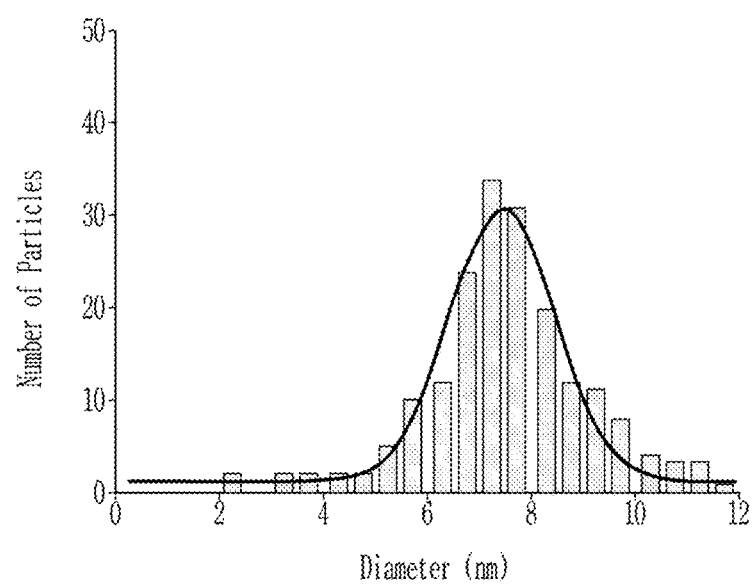

A photoluminescent analysis of the prepared quantum dots is performed and the results are listed in Table 1 and FIG. 8A. A TEM analysis is conducted for the quantum dots and the results are shown in FIG. 8B. The QDs show, e.g., exhibit, an average solidity of about 0.8.

An ICP-AES analysis of the prepared quantum dots is performed and the results are listed in Table 2.

2. Production of a Quantum Dot Composite and a Pattern Thereof (1) A chloroform dispersion including the plurality of the quantum dots of Preparation Example 1 is prepared and is mixed with a solution of a binder polymer, which is a four membered copolymer of methacrylic acid, benzyl methacrylate, hydroxyethyl methacrylate, and styrene, (acid value: 130 milligrams (mg) of KOH per gram (mg KOH/g), molecular weight: 8,000 grams per mole (g/mol)) (solvent: propylene glycol monomethyl ether acetate, PGMEA, a concentration of 30 percent by weight, wt %) to form a quantum dot-binder dispersion.

To the prepared quantum dot-binder dispersion, a hexaacrylate having the following structure (as a photopolymerizable monomer), ethylene glycol di-3-mercaptopropionate (hereinafter, 2T, as a multi-thiol compound), an oxime ester compound (as an initiator), $TiO_2$ as a metal oxide fine particle (light diffusing agent), and PGMEA (as a solvent) are added to obtain a composition.

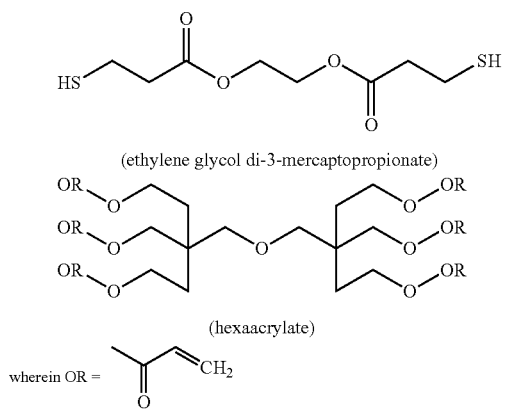

(ethylene glycol di-3-mercaptopropionate)

(hexaacrylate)

wherein OR = based on a total solid content, the prepared composition includes 40 weight percent (wt %) of quantum dots, 12.5 wt % of the binder polymer, 25 wt % of 2T, 12 wt % of the photopolymerizable monomer, 0.5 wt % of the photoinitiator, and 10 wt % of a light diffusing agent. The total solid content is about 25%.

The obtained composition is spin-coated on a glass substrate at 150 revolutions per minute (rpm) for 5 seconds (s) to provide a film. The obtained film is pre-baked at 100° C. (PRB). The pre-baked film is exposed to light (wavelength: 365 nanometers (nm), intensity: 100 millijoules (mJ), under a mask having a predetermined pattern (e.g., a square dot or stripe pattern) for 1 second (s) (EXP) and developed with a potassium hydroxide aqueous solution (concentration: 0.043 weight %) for 50 seconds to obtain a pattern of a quantum dot polymer composite (thickness: 10 micrometers (μm)).

The obtained pattern is heat-treated at a temperature of 180° C. for 30 minutes under a nitrogen atmosphere (POB).

For the quantum dot composite pattern thus obtained, blue light absorption and light emission are measured and the results are shown in Table 3.

Example 2 and Example 3

Quantum dots are prepared in the same manner as in Example 1, except for changing the amounts of the zinc precursor, the selenium precursor, and the sulfur precursor per one mole of indium to obtain the composition set forth in Table 2.

A photoluminescent analysis of the prepared quantum dots is performed and the results are listed in Table 1. An ICP-AES analysis of the prepared quantum dots is performed and the results are listed in Table 2.

A quantum dot composite pattern is prepared in the same manner as in Example 1, except for using the prepared quantum dots.

For the quantum dot composite pattern thus obtained, blue light absorption and light emission are measured and the results are shown in Table 3.

Comparative (Comp.) Example 1

Quantum dots are prepared in the same manner as in Example 1, except for preparing the zinc precursor as disclosed herein, changing the reaction temperature to 280° C., and changing the used amounts of the zinc precursors, the selenium precursors, and the sulfur precursors:

In a 200 mL reaction flask, 1.6 mmol of zinc acetate and oleic acid are dissolved in trioctyl amine and the solution is subjected to vacuum at 120° C. for one hour, then is heated under a nitrogen atmosphere to 280° C. for 10 minutes to prepare a reaction medium including a zinc precursor.

A photoluminescent analysis of the prepared quantum dots is performed and the results are listed in Table 1. An ICP-AES analysis of the prepared quantum dots is performed and the results confirm that the nominal size of the quantum dots is 7.5 nm and a ratio of S:Se is about 0.7 or less:1.

A quantum dot composite pattern is prepared in the same manner as in Example 1, except for using the prepared quantum dots. For the quantum dot composite pattern thus obtained, blue light absorption and light emission are measured and the results are shown in Table 3.

Comparative Example 2

Quantum dots are prepared in the same manner as in Example 1, except for preparing the zinc precursor as set forth in Comparative Example 1, and changing the used amounts of the zinc precursors, the selenium precursors, and the sulfur precursors.

A photoluminescent analysis of the prepared quantum dots is performed and the results are listed in Table 1. An ICP-AES analysis of the prepared quantum dots is performed and the results confirm that the nominal size of the quantum dots is 7.9 nm and a ratio of S:Se is about 0.7 or less:1.

A quantum dot composite pattern is prepared in the same manner as in Example 1, except for using the prepared quantum dots. For the quantum dot composite pattern thus obtained, blue light absorption and light emission are measured and the results are shown in Table 3.

Comparative Example 3

Quantum dots are prepared in the same manner as in Example 1, except for preparing the zinc precursor as set forth in Comparative Example 1, and changing the used amounts of the zinc precursors, the selenium precursors, and the sulfur precursors.

A photoluminescent analysis of the prepared quantum dots is performed and the results are listed in Table 1. An ICP-AES analysis of the prepared quantum dots is performed and the results are shown in Table 2.

A quantum dot composite pattern is prepared in the same manner as in Example 1, except for using the prepared quantum dots. For the quantum dot composite pattern thus obtained, blue light absorption and light emission are measured and the results are shown in Table 3.

Comparative Example 4

Quantum dots are prepared in the same manner as in Example 1, except for preparing the zinc precursor as set forth in Comparative Example 1, and changing the used amounts of the zinc precursors, the selenium precursors, and the sulfur precursors.

A photoluminescent analysis of the prepared quantum dots is performed and the results are listed in Table 1. An ICP-AES analysis of the prepared quantum dots is performed and the results confirm that the nominal size of the quantum dots is 7.9 nm and a ratio of Se:In is about 5.73.

A quantum dot composite pattern is prepared in the same manner as in Example 1, except for using the prepared quantum dots. For the quantum dot composite pattern thus obtained, blue light absorption and light emission are measured and the results are shown in Table 3.

TABLE 1

|  | FWHM (nm) | Quantum Yield (QY) (%) | Tail emission (%) |
|---|---|---|---|
| Example 1 | 38 | ~95% | 5.6% |
| Example 2 | 37 | ~95% | 4.4% |
| Example 3 | 38 | ~95% | 5.3% |
| comp. Example 1 | 40 | 91 | 9.7% |
| comp. Example 2 | 50 | 75 | 16.5% |
| comp. Example 3 | 39 | ~95% | 9.9% |
| comp. Example 4 | 38 | ~95% | 6.6% |

Table 1 shows that the quantum dots of the Examples may exhibit a significantly low level of a tail emission percentage at 570 nm in comparison with the quantum dots of the comparative Examples.

TABLE 2

|  | S:In | Zn:In | Se:In | S:Se | (S + Se):In | ZnSe (nm) | ZnS (nm) | Nominal size (nm) |
|---|---|---|---|---|---|---|---|---|
| Example 1 | 4.73:1 | 11.77:1 | 5.44:1 | 0.86948:1 | 10.17:1 | 1.46 | 0.58 | 7.7 |
| Example 2 | 4.68:1 | 11.73:1 | 5.53:1 | 0.84629:1 | 10.21:1 | 1.50 | 0.58 | 7.8 |
| Example 3 | 4.16:1 | 10.77:1 | 5.49:1 | 0.75774:1 | 9.65:1 | 1.49 | 0.52 | 7.7 |
| comp. Example 3 | 5.10:1 | 12.02:1 | 5.56:1 | 0.91726:1 | 10.66:1 | 1.51 | 0.62 | 7.9 |

TABLE 3

|  | Film PL wavelength (nm) | Absorption (%) | Light emission after POB (under $N_2$) |
|---|---|---|---|
| Example 1 | 637.5 | 94.5% | ~40% |
| Example 2 | 642.4 | 95.1% | ~40% |
| Example 3 | 642.3 | 95.7% | ~40% |
| comp. Example 1 | 641.5 | 94% | 35% |
| comp. Example 2 | 631.4 | 94% | 29% |
| comp. Example 3 | 640.3 | 94% | 40% |
| comp. Example 4 | 638.9 | 94% | 40% |

Operation Reliability Test

Figure 9:
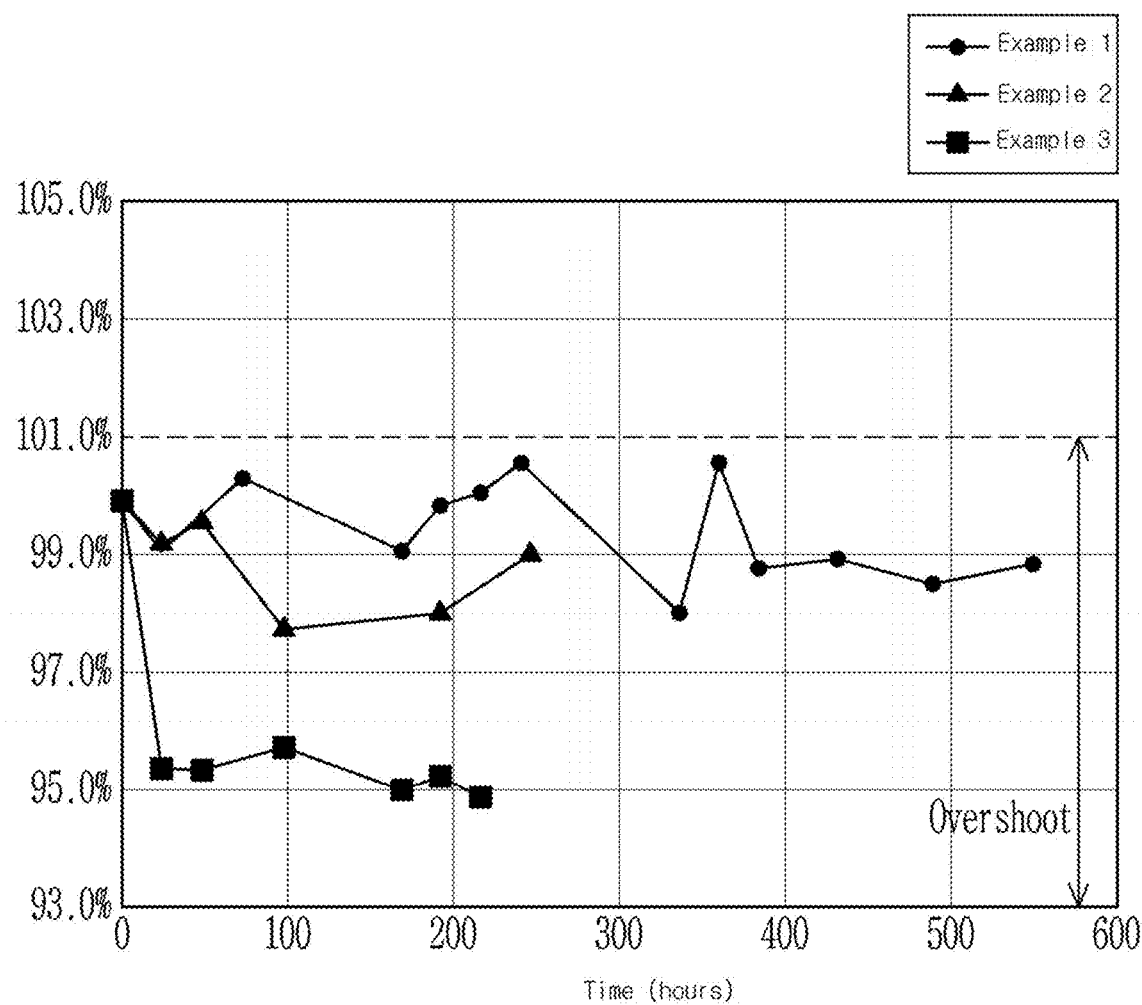
FIG. 9 is a graph of luminescence relative to an initial luminescence (percent (%)) versus time (hours) showing the results of the reliability evaluation of the quantum dot composites prepared in Examples 1 to 3.
Figure 10:
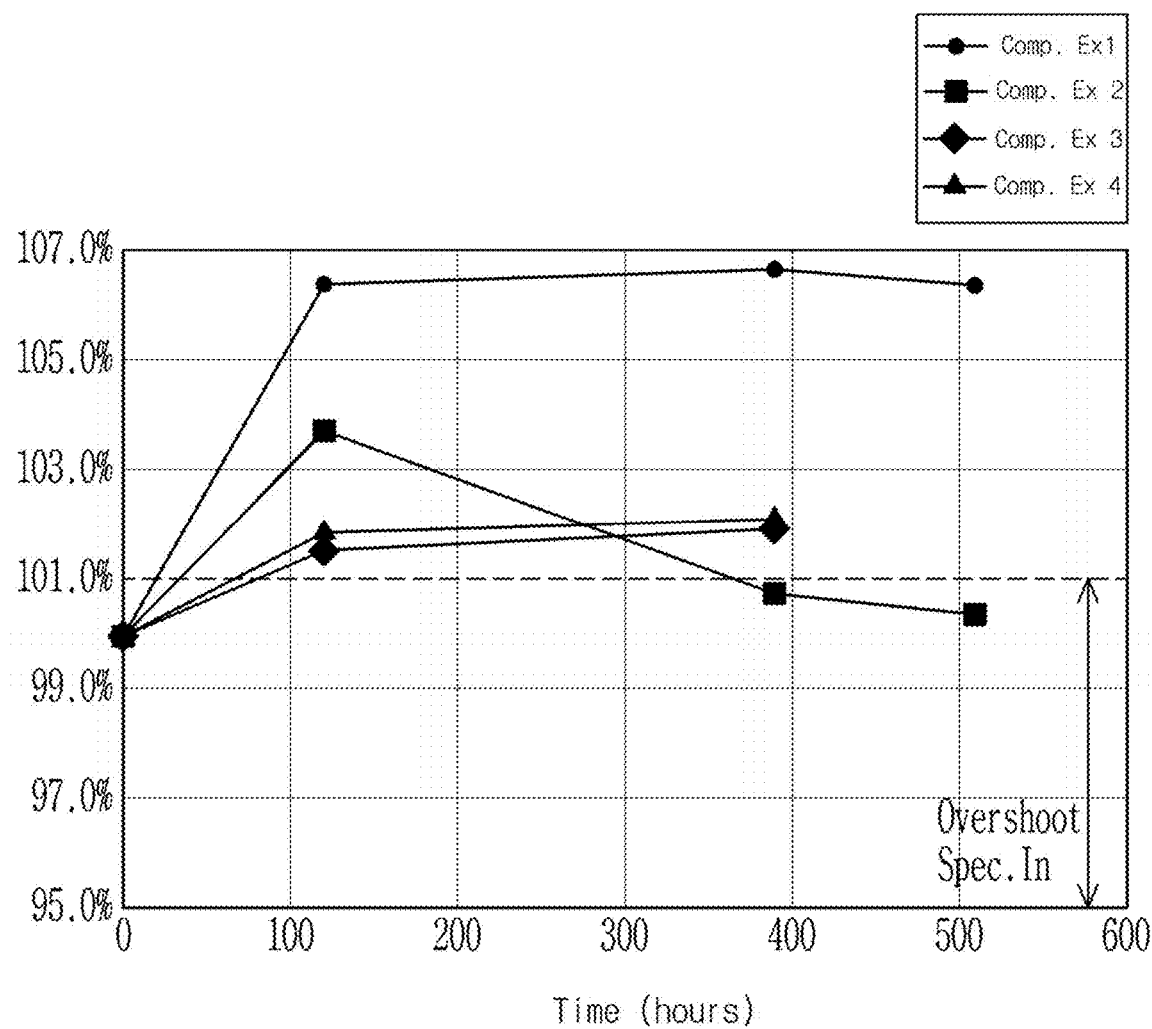
FIG. 10 is a graph of luminescence relative to an initial luminescence (%) versus time (hours) showing the results of the reliability evaluation of the quantum dot composites prepared in Comparative Examples 1 to 3.

For each of the quantum dot composite pattern of Examples 1 to 3 and the quantum dot composite pattern of Comparative Example 1 to 3, an operation reliability test is carried out as disclosed herein and the results are shown in FIG. 9 and FIG. 10:

Using a 1,500 nit BLU (wavelength: 450 nm) as a light source, the composite is irradiated with the incident light and the luminance of the composite is measured with QE 2100 equipped with an integration sphere.

The results of FIG. 9 and FIG. 10 confirm that in case of the quantum dot composite pattern of the Examples, the overshoot phenomenon can be significantly suppressed in comparison with those of the comparative Examples and can be kept in a desired range.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A quantum dot composite comprising:
a matrix, and
a plurality of quantum dots dispersed in the matrix,
wherein the plurality of quantum dots comprise
a metal comprising indium and zinc, and
a non-metal comprising phosphorous, selenium, and sulfur,
wherein the plurality of quantum dots has
a mole ratio of sulfur to indium of greater than or equal to about 3:1 and less than or equal to about 6:1, and
a mole ratio of sulfur to selenium of greater than or equal about 0.69:1 and less than or equal to about 0.89:1, and
a mole ratio of zinc to indium of greater than or equal to about 10:1 and less than or equal to about 12.4:1,
wherein the plurality of the quantum dots is configured to emit red light, and
wherein the quantum dot composite is configured to maintain a luminescence of less than about 103 percent relative to an initial luminescence thereof when the quantum dot composite is irradiated with light having a wavelength of from about 450 nanometers to about 470 nanometers for a time period of greater than or equal to about 100 hours.

2. The quantum dot composite of claim 1, wherein the quantum dot composite is configured to exhibit a luminance less than the initial luminance when irradiated with light having a wavelength of from about 450 nanometers to about 470 nanometers for about 30 hours or less.

3. The quantum dot composite of claim 1, wherein a luminance peak wavelength of the red light is in a range of greater than or equal to about 600 nanometers to less than or equal to about 650 nanometers.

4. The quantum dot composite of claim 1, wherein in a photoluminescent spectrum of the quantum dot composite, a percentage of an intensity at 570 nanometers relative to an intensity at a photoluminescent peak wavelength is less than or equal to about 6.5%.

5. The quantum dot composite of claim 1, wherein the plurality of the quantum dots has a mole ratio of sulfur to indium of greater than or equal to about 4.1:1 and less than or equal to about 5:1.

6. The quantum dot composite of claim 1, wherein in the plurality of the quantum dots, a mole ratio of indium to a total sum of sulfur and selenium is greater than or equal to about 0.096:1 and less than or equal to about 0.109:1.

7. The quantum dot composite of claim 1, wherein a nominal size of the plurality of the quantum dots is less than or equal to about 8 nanometers.

8. The quantum dot composite of claim 1, wherein the plurality of quantum dots comprises a semiconductor nanocrystal core comprising indium and phosphorus and a semiconductor nanocrystal shell disposed on the semiconductor nanocrystal core, the semiconductor nanocrystal shell comprising zinc, selenium, and sulfur.

9. The quantum dot composite of claim 1, wherein the matrix comprises a polymerizable monomer comprising a carbon-carbon double bond, a thiol-containing compound, a polymer, an organic solvent, or a combination thereof.

10. The quantum dot composite of claim 1, wherein the quantum dot composite is in a form of a patterned film.

11. The quantum dot composite of claim 10, wherein the quantum dot composite exhibits an absorption of greater than or equal to about 94% with respect to a blue light having a wavelength of about 450 nanometers to about 470 nanometers.

12. A color conversion panel comprising the quantum dot composite of claim 1.

13. The quantum dot composite of claim 1, wherein
the color conversion panel comprises a color conversion layer comprising a color conversion region and optionally a partition wall defining each region of the color conversion layer, and
the color conversion region comprises a first region that is configured to emit a first light, and the first region comprises the quantum dot composite.

14. A display panel comprising
a light emitting panel,
a color conversion panel of claim 12, and
a light transmitting layer disposed between the light emitting panel and the color conversion panel.

15. Quantum dots comprising
a metal, and
a non-metal,
wherein the metal comprises indium and zinc,
wherein the non-metal comprises phosphorus, selenium, and sulfur,
wherein the quantum dots comprise
a mole ratio of zinc to indium of greater than or equal to about 10:1 and less than or equal to about 12.4:1,
a mole ratio of sulfur to indium of greater than or equal to about 3:1 and less than or equal to about 6:1,
a mole ratio of sulfur to selenium of greater than or equal to about 0.69:1 and less than or equal to about 0.89:1,
wherein the quantum dots are configured to emit red light and a maximum peak wavelength of the red light is greater than or equal to about 600 nanometers and less than or equal to about 670 nanometers, and
wherein in a photoluminescent spectrum, the quantum dots exhibit a tail intensity percentage at about 570 nanometers of less than or equal to about 6.5%.

16. The quantum dots of claim 15, wherein the quantum dots have a mole ratio of sulfur to indium of greater than or equal to about 4.1:1 and less than or equal to about 5:1.

17. The quantum dots of claim 15, wherein the quantum dots have a mole ratio of zinc to indium of greater than or equal to about 10:1 and less than or equal to about 12:1.

18. The quantum dots of claim 15, wherein in the plurality of the quantum dots, a mole ratio of indium to a total sum of sulfur and selenium is greater than or equal to about 0.096:1 and less than or equal to about 0.109:1.

19. The quantum dots of claim 15, wherein a nominal size of the quantum dots is greater than or equal to about 7.5 nanometers and less than or equal to about 8 nanometers.

20. The quantum dots of claim 15, wherein the quantum dots have a particle size distribution of greater than or equal to about 10% and less than or equal to about 18% of an average size thereof, as determined in an electron microscopy analysis, and the quantum dots have an average value of solidity of greater than or equal to about 0.8.

* * * * *